United States Patent
Zając et al.

(10) Patent No.: US 12,101,893 B2
(45) Date of Patent: Sep. 24, 2024

(54) METHODS OF DISPENSING A METALLIC NANOPARTICLE COMPOSITION FROM A NOZZLE ONTO A SUBSTRATE

(71) Applicant: XTPL S.A., Wrocław (PL)

(72) Inventors: Mateusz Zając, Gdansk (PL); Urszula Nowak, Wrocław (PL); Piotr Kowalczewski, łódzkie (PL); Filip Granek, Mrozów (PL); Jan Kotarski, Wrocław (PL); Maciej Tybel, Wrocław (PL); Szymon Zięba, Wrocław (PL)

(73) Assignee: XTPL S.A., Wrocław (PL)

( * ) Notice: Subject to any disclaimer, the term of this patent is extended or adjusted under 35 U.S.C. 154(b) by 300 days.

(21) Appl. No.: 17/596,920

(22) PCT Filed: Jul. 28, 2020

(86) PCT No.: PCT/IB2020/057100
§ 371 (c)(1),
(2) Date: Dec. 21, 2021

(87) PCT Pub. No.: WO2021/019435
PCT Pub. Date: Feb. 4, 2021

(65) Prior Publication Data
US 2022/0312596 A1 Sep. 29, 2022

Related U.S. Application Data

(60) Provisional application No. 62/903,053, filed on Sep. 20, 2019, provisional application No. 62/879,832, filed on Jul. 29, 2019.

(51) Int. Cl.
*H05K 3/12* (2006.01)
*B05D 1/26* (2006.01)

(52) U.S. Cl.
CPC ............. *H05K 3/1241* (2013.01); *B05D 1/26* (2013.01); *B05D 1/265* (2013.01); *H05K 2201/0257* (2013.01); *H05K 2203/0126* (2013.01)

(58) Field of Classification Search
CPC ......... H05K 3/1241; H05K 2201/0257; H05K 2203/0126; B05D 1/26; B05D 1/265
(Continued)

(56) References Cited

U.S. PATENT DOCUMENTS 4,664,945 A * 5/1987 Maeda ................... H01L 21/705
257/E21.534
5,151,377 A * 9/1992 Hanoka ................ H05K 3/1241
438/674
(Continued)

FOREIGN PATENT DOCUMENTS

WO WO-2018199644 A1 * 11/2018 .............. B41M 1/26
WO 2021019435 A1 2/2021

OTHER PUBLICATIONS

International Search Report and Written Opinion for International PCT Application No. PCT/IB2020/056215, dated Nov. 2, 2020.

*Primary Examiner* — Brian K Talbot
(74) *Attorney, Agent, or Firm* — K&L Gates LLP

(57) ABSTRACT

A method of dispensing a metallic nanoparticle composition along a trajectory on a substrate is disclosed. The composition is dispensed from a nozzle through its outlet. The outlet is characterized by an outlet size. First, an initial pressure is applied to the composition in the nozzle to cause the composition to flow from the outlet. The nozzle is positioned at a height such that the composition does not flow onto the substrate. Second, the nozzle is lowered toward the substrate such that a fluid bridge forms between the outlet and the substrate and an adjusted pressure is applied to the composition in the nozzle. The adjusted (Continued)

pressure is lower than needed for the composition to continue to flow from the outlet. Third, the fluid is dispensed from the nozzle. A dispensing pressure is applied to the fluid while the nozzle is laterally displaced along the trajectory on the substrate.

37 Claims, 17 Drawing Sheets

(58) Field of Classification Search
USPC .......................................................... 427/96.1
See application file for complete search history.

(56) References Cited

U.S. PATENT DOCUMENTS

| | | | |
|---|---|---|---|
| 5,455,062 A * | 10/1995 | Muhlfriedal | B05D 1/26 118/423 |
| 5,965,209 A * | 10/1999 | Komatsu | G03F 7/16 118/421 |
| 6,383,571 B1 * | 5/2002 | Muhlfriedel | B05C 9/02 427/420 |
| 6,866,881 B2 * | 3/2005 | Prentice | B23K 3/0623 427/256 |
| 10,112,210 B2 * | 10/2018 | Wakamoto | H01L 21/6715 |
| 11,512,210 B2 * | 11/2022 | Seol | B33Y 70/10 |
| 11,597,225 B2 * | 3/2023 | Seol | C09D 11/107 |
| 2008/0273061 A1 * | 11/2008 | Tsuchiya | B41J 2/06 347/55 |
| 2009/0226605 A1 | 9/2009 | Chopra et al. | |
| 2013/0142566 A1 * | 6/2013 | Yu | H01L 24/49 205/114 |
| 2015/0321434 A1 * | 11/2015 | Sterman | B29C 70/745 264/255 |
| 2018/0047562 A1 | 2/2018 | deVilliers et al. | |
| 2020/0407880 A1 * | 12/2020 | Madou | B29C 48/142 |

* cited by examiner

METHODS OF DISPENSING A METALLIC NANOPARTICLE COMPOSITION FROM A NOZZLE ONTO A SUBSTRATE

CROSS-REFERENCE TO RELATED APPLICATIONS

This application is a U.S. National Stage Entry under 35 U.S.C. § 371 of International Patent Application No. PCT/IB2020/057100, entitled METHODS OF DISPENSING A METALLIC NANOPARTICLE COMPOSITION FROM A NOZZLE ONTO A SUBSTRATE, filed Jul. 28, 2020, which claims benefit under 35 U.S.C. § 119 (e) to U.S. Provisional Application No. 62/879,832, filed Jul. 29, 2019, entitled METHOD OF DISPENSING A FLUID FROM A NOZZLE ONTO A SUBSTRATE and U.S. Provisional Application No. 62/903,053, filed Sep. 20, 2019, entitled METHODS OF DISPENSING A METALLIC NANOPARTICLE COMPOSITION FROM A NOZZLE ONTO A SUBSTRATE, the entire disclosures of which are hereby incorporated by reference herein.

BACKGROUND

Recent progress in nanoparticle compositions and fluid printing apparatuses have enabled dispensing conductive nanoparticle features having line widths in a range of about 1 μm to 20 μm. A printing apparatus includes a nozzle having an outlet and an inlet, and the outlet is characterized by an outlet size. Line width control is achieved in part by bringing an outlet of a certain outlet size into contact with the substrate while the fluid (metallic nanoparticle composition, for example) is dispensed through the outlet onto the substrate.

In some cases, it is necessary to dispense fluids on surfaces that are not flat. The surface on which the fluid is to be dispensed can be non-flat if there are existing features on the substrate. The existing features can be circuit elements such as transistors, resistors, and electrically conductive features including wires. If the printing apparatus dispenses fluid with the nozzle in contact with the substrate, it may be difficult to traverse existing conductive features.

Therefore, there is a need for an improved method for dispensing fluid from a nozzle onto a substrate. According to such a method, it should be possible for the nozzle to traverse an upward step or downward step along a trajectory on the substrate.

SUMMARY OF THE INVENTION

In one aspect, a method of dispensing a metallic nanoparticle composition along a trajectory on a substrate includes the steps of: initializing the nozzle, initializing a fluid bridge, and dispensing the composition from the nozzle onto the substrate. The composition is dispensed from a nozzle through its outlet. The outlet is characterized by an outlet size. First, in the step of initializing the nozzle, an initial pressure is applied to the composition in the nozzle to cause composition to flow from the outlet, and the outlet is positioned at an initial height above the substrate such that the composition does not flow onto the substrate. Second, in the step of initializing the fluid bridge, the outlet is lowered toward the substrate such that a fluid bridge forms between the outlet and the substrate and an adjusted pressure is applied to the composition in the nozzle. The adjusted pressure is lower than needed for the composition to continue to flow from the outlet. Third, in the step of dispensing the fluid from the nozzle, a dispensing pressure is applied to the fluid while the nozzle is laterally displaced along the trajectory on the substrate. The dispensing pressure is less than or equal to the adjusted pressure.

In another aspect, a method of dispensing a metallic nanoparticle composition along a trajectory on a substrate includes the steps of: initializing a meniscus, initializing a fluid bridge, adjusting a vertical position of the nozzle, and dispensing the composition from the nozzle onto the substrate. The composition is dispensed from a nozzle through its outlet. The outlet is characterized by an outlet size. First, in the step of initializing the meniscus, the outlet is positioned at an initial height above the substrate and an initial pressure is applied to the composition in the nozzle to cause a meniscus to protrude downward from the outlet. Second, in the step of initializing the fluid bridge, the outlet is lowered to an intermediate height above the substrate and an intermediate pressure is applied to the composition, such that a fluid bridge forms between the outlet and the substrate. Third, in the step of adjusting the vertical position of the nozzle, the outlet is raised to an adjusted height and an adjusted pressure is applied to the composition such that the fluid bridge remains in contact with the outlet and the substrate. Fourth, in the step of dispensing the fluid from the nozzle, a dispensing pressure is applied to the fluid while the nozzle is laterally displaced along the trajectory on the substrate.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to metallic nanoparticle compositions and methods of preparing these metallic nanoparticle compositions.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
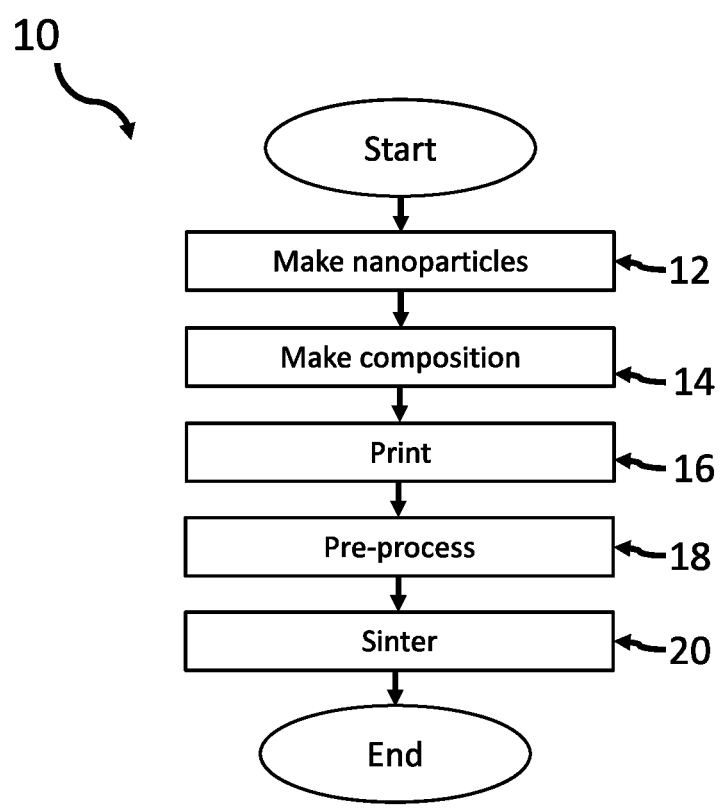
FIG. 1 is a flow diagram of a process of forming a printed conductive feature on a substrate.

FIG. 1 is a flow diagram of a process 10 of forming a conductive feature on a printable surface of a substrate. In the present disclosure, metallic nanoparticles are used to form the conductive features. Among various metallic nanoparticles, silver nanoparticles and copper nanoparticles are important because of the high electrical conductivity of silver and copper. For example, silver nanoparticles having an average particle size in a range of 20 nm to 80 nm, and copper nanoparticles having an average particle size in a range of 50 nm to 225 nm have been considered. Because of the lower cost of copper compared to silver, it may be preferable to use copper nanoparticles for achieving greater line widths (wider lines).

At step 12, the metallic nanoparticles are made. Generally, the synthesis of metallic nanoparticles in solution employs three components: (1) metal precursors (e.g., $AgNO_3$ for silver nanoparticles and $Cu(NO_3)_2$ for copper nanoparticles); (2) reducing agents (e.g., ethylene glycol for silver nanoparticles and sodium hypophosphite for copper nanoparticles); and (3) stabilizing (capping) agents (e.g., polyvinylpyrrolidone). Polyvinylpyrrolidone, abbreviated as PVP, is soluble in water and other polar solvents. When PVP is effectively used as a dispersant, stable colloidal silver nanoparticles or copper nanoparticles covered (capped) with PVP polymer can be obtained in small size (<250 nm) because the PVP reduces the aggregation of the silver or copper nanoparticles. The synthesis of silver nanoparticles and copper nanoparticles is described in detail in the Examples hereinbelow.

The average size of the silver nanoparticles can be controlled to within a range of 20 nm to 80 nm. The average size of the copper nanoparticles can be controlled to within a range of 50 nm to 225 nm. The average particle size and dispersity can be controlled by controlling thermodynamic and kinetic reaction parameters. Reaction temperature, temperature ramp, and reaction time are the important thermodynamic reaction parameters. In second case, the reagents addition rate of adding reagents and molar ratio of used metal precursor to stabilizing agent (PVP) are the important kinetic reaction parameters. An appropriate combination of these parameters leads to obtaining nanoparticles that exhibit the desired properties of small particles size, low dispersity, and high dispersion stability (low occurrence of aggregation).

At step 14, a metallic nanoparticle composition is made from the metallic nanoparticles from step 12. The preparation of metallic nanoparticle compositions is described in detail in the Examples hereinbelow. Generally, the nanoparticles are separated, to remove impurities and excess PVP, and dispersed in a solvent mixture including a first solvent and an optional second solvent. The metallic nanoparticle composition may optionally include additives to better control its physicochemical properties. These additives include surfactants, binders, adhesion promoters, and antifoaming agents. We have found that it is preferable for the concentration of such additives to be 3% or less by weight in the metallic nanoparticle composition, or 1% or less by weight in the metallic nanoparticle composition.

At step 16, the metallic nanoparticle composition is dispensed on a printable surface of a substrate using a fluid printing apparatus. In the experimental results described herein, the composition is dispensed on a clean glass substrate to form a dispensed feature. Details of an illustrative fluid printing apparatus and methods of printing are described in detail with reference to FIGS. 2 through 13. Nevertheless, the metallic nanoparticle compositions described herein are not limited to being used in these illustrative fluid printing apparatuses.

At step 18, the work piece, i.e., the substrate with the dispensed feature thereon, undergoes optional pre-processing. For example, the work piece can be pre-processed in a convection oven at a temperature in a range of 100° C. to 300° C. for a period of 5 minutes to 60 minutes. During the pre-processing step, solvents remaining in the precursor feature are vaporized. It has been found that the pre-processing step can improve the adhesion of the dispensed feature to the substrate.

At step 20, the work piece is sintered. For example, the work piece can be sintered in a convection oven at a temperature in a range 300° C. to 500° C. for a period of 5 minutes to 90 minutes. Alternatively, photonic sintering, such as by using a laser or a flash lamp, can be used. The use of PVP as a capping agent reduces the aggregation of nanoparticles in the metallic nanoparticle compositions, but the capping of the nanoparticle surfaces by PVP results in lower electrical conductivity. The sintering process removes the PVP and organic remains. Therefore, sintering is important for bringing out high electrical conductivity in the resulting conductive features.

TABLE 1

| Solvent | Molecular weight | Density (g/ml) | Boiling point (° C.) | Viscosity (cP) | No. of hydroxyl groups | Surface tension (mN/m) | Use in Composition |
|---|---|---|---|---|---|---|---|
| Propylene glycol | 76.09 | 1.036 | 187.4 | 48.6 (25° C.) | 2 | 45.6 | First Solvent |
| Ethylene glycol | 62.07 | 1.113 | 197 | 16.9 (25° C.) | 2 | 48.4 | First Solvent |
| Diethylene glycol | 106.12 | 1.118 | 245 | 35.7 (25° C.) | 2 | 44.8 | First Solvent |
| Glycerol | 92.09 | 1.261 | 290 | 1408 (20° C.), 610 (30° C.) | 3 | 63.4 | Second Solvent |

Several solvents suitable for use in metallic nanoparticle compositions, along with their physicochemical properties (molecular weight, density, boiling point, viscosity, number of hydroxyl groups, and surface tension), are listed in Table 1. The solvents are all non-aqueous polar protic solvents, with 2 or 3 hydroxyl groups in the molecular structure. The boiling point ranges from 187.4° C. (propylene glycol) to 290° C. (glycerol), and the viscosity ranges from 48.6 cP (propylene glycol) to ~$10^3$ cP (glycerol).

Several different metallic nanoparticle compositions have been considered. Example compositions are summarized in Table 2 below. The compositions of Examples 1, 2, 3, 4, and 9 contain copper nanoparticles (average nanoparticle size of 160 nm) at varying concentrations (in a range of 32 to 54 wt %) and the compositions of Examples 5, 6, 7, 8, 10, and 11 contain silver nanoparticles (average nanoparticle size of 45 nm) at varying concentrations (in a range of 55 wt % to 60 wt %). In all of the Examples listed in Table 2, propylene glycol is used as the first solvent. In some Examples (Examples 1, 2, 3, 6, 7, and 9), a second solvent of glycerol is used, and in other Examples (Examples 4, 5, 8, 10, and 11), no second solvent is used. The compositions of Examples 1, 2, 3, 6, 7, and 9 contain the second solvent of glycerol at varying concentrations (in a range of approximately 4 wt % to 9 wt %). In addition, the Example 2 composition contains a polyether-modified siloxane surfactant (BYK-349) at a concentration of 0.3 wt % and PVP (K30 grade) added to the composition during the formulation stage, at a concentration of approximately 2 wt %.

TABLE 2

| Example | NP | NP concentration (wt %) | Second solvent | Second solvent concentration (wt %) | Other additives |
|---|---|---|---|---|---|
| 1 | Cu | 40-42 | Glycerol | 8.4 | |
| 2 | Cu | 32-34 | Glycerol | 7.4 | BYK-349, 0.3 wt %; PVP K30 ~2 wt % |
| 3 | Cu | 52-54 | Glycerol | 8.8 | |
| 4 | Cu | 52-54 | None | 0 | |
| 5 | Ag | 60 | None | 0 | |
| 6 | Ag | 60 | Glycerol | 4.93 | |
| 7 | Ag | 56 | Glycerol | 4.60 | |
| 8 | Ag | 57 | None | 0 | |
| 9 | Cu | 39 | Glycerol | 8.06 | TBT 4 wt % |
| 10 | Ag | 57.6 | None | 0 | TBT 4 wt % |
| 11 | Ag | 55 | None | 0 | |

The metallic nanoparticle compositions of the present invention are suitable for use in fluid printing apparatuses. Illustrative fluid printing apparatuses and methods of printing are described with reference to FIGS. 2 through 13.

Figure 2:
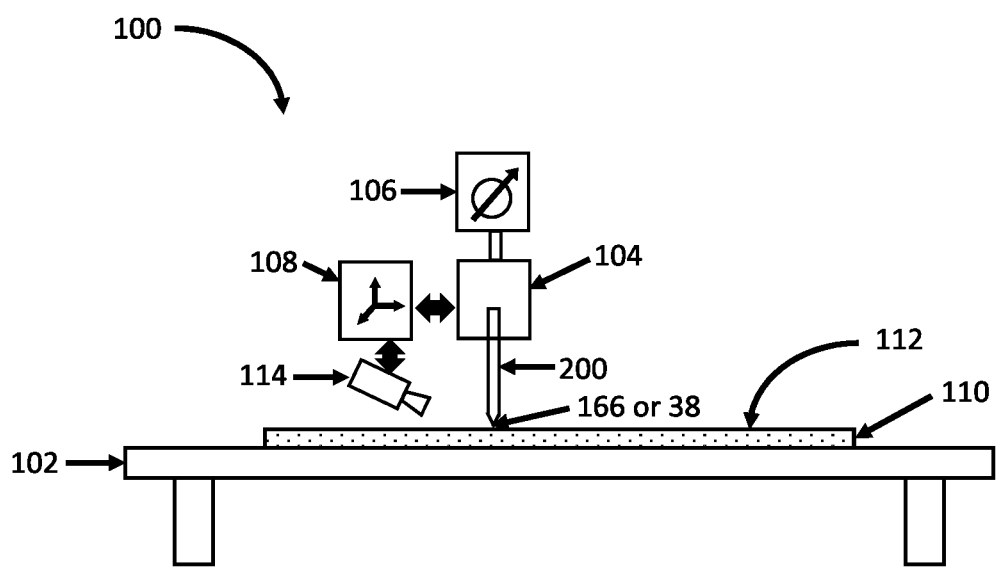
FIG. 2 is a block diagram view of an illustrative fluid printing apparatus.
Figure 9:
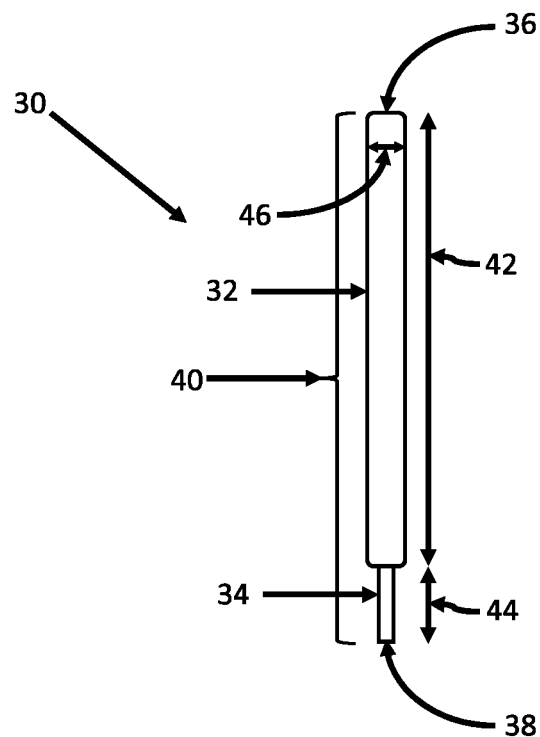
FIG. 9 is a schematic side view of a stainless-steel needle.
Figure 10:
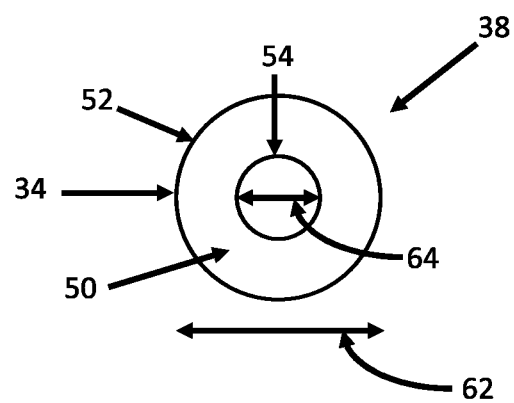
FIG. 10 is a schematic bottom view of the tip portion of the stainless-steel needle of FIG. 9.

An illustrative fluid printing apparatus is explained with reference to FIG. 2. FIG. 2 is a block diagram view of an illustrative fluid printing apparatus. The fluid printing apparatus 100 includes a substrate stage 102, a print head 104, a pneumatic system 106, and a print head positioning system 108, and an imaging system 114. A substrate 110 is fixed in position on the substrate stage 102 during the printing (dispensing) and has a printable surface 112, which is facing upward and facing towards the print head 104. The print head 104 is positioned above the substrate 110. The print head includes a nozzle 200, and the nozzle 200 includes outlet 166 (FIG. 7) or outlet 38 (FIGS. 9 and 10).

The substrate 110 can be of any suitable material, such as glass or silicon. A flexible substrate or a rigid substrate can be used. Furthermore, the substrate can have existing metal lines, circuitry, or other deposited materials thereon. For example, the present disclosure relates to an open defect repair apparatus, which can print lines in an area where there is an open defect in the existing circuit. In such case, the substrate can be a thin-film transistor array substrate for a liquid crystal display (LCD) or a micro light-emitting diode (micro-LED) array.

The print head includes a nozzle. Commercially available glass capillary tubes can be used as a nozzle. For example, capillary glass tubes (Eppendorf™ Femtotips™ II Microinjection Capillary Tips), having an inner diameter at the tip of 0.5 μm and an outer diameter at the tip of 0.7 μm, are available from Fisher Scientific. A commercially available glass capillary tube 120 is shown schematically in FIG. 3. The glass capillary tube has an inlet 124 at a first end, an outlet 132 at a second end opposite the first end, and an elongate fluid passageway between the inlet 124 and outlet 132. A plastic handle 122 is attached to the glass capillary tube 120 around its circumference. The plastic handle 122 is located at and near the inlet (input end) 124 and includes a threaded portion 126 near the inlet 124 which enables a threaded connection to an external body or external conduit (not shown in FIG. 3). The inlet 124 has an inner diameter of 1.2 mm.

Figures 4, 5:
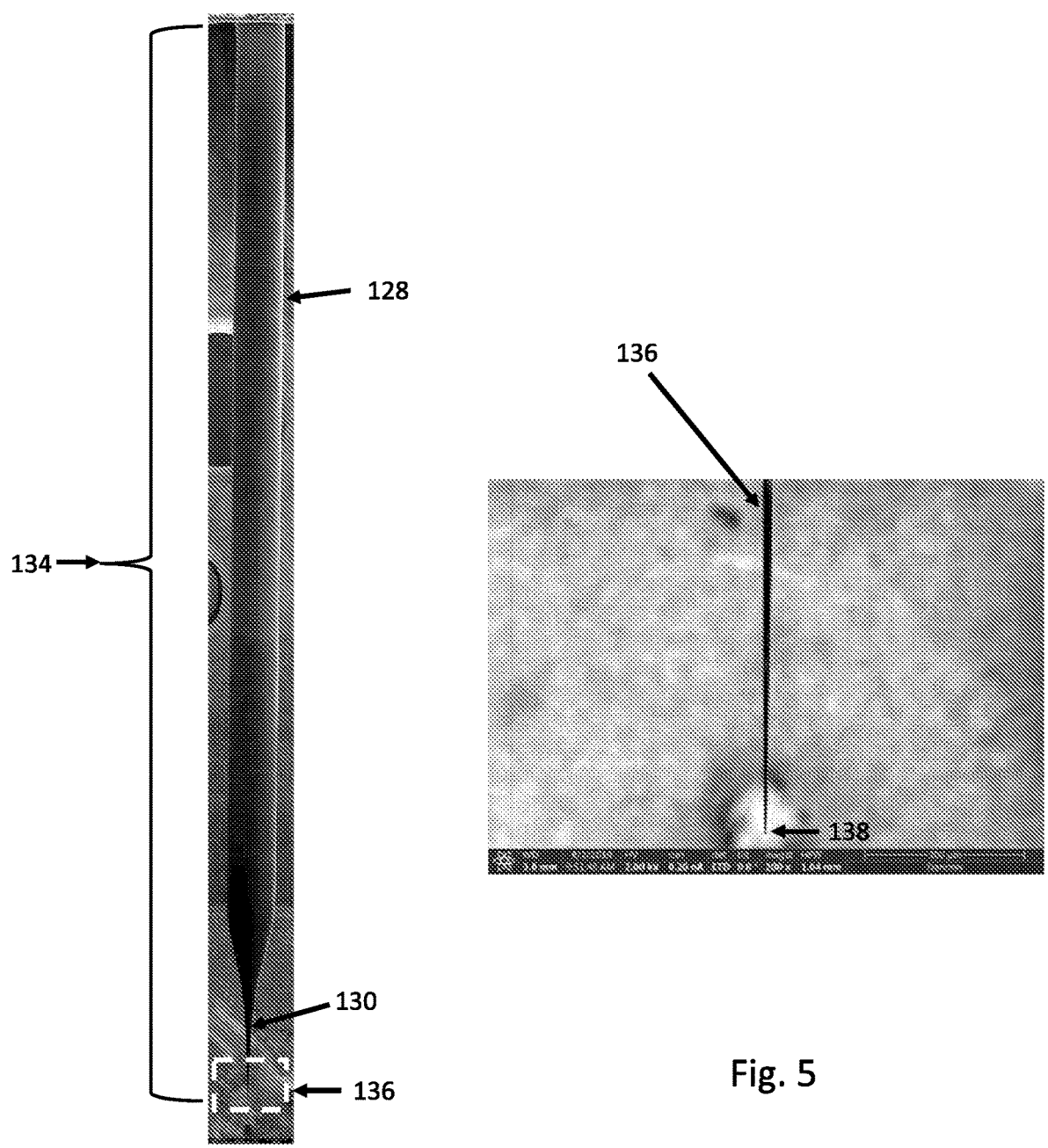
FIG. 4 is a scanning electron microscope (SEM) view of a portion of a glass capillary tube.
FIG. 5 is a scanning electron microscope (SEM) view of a tapering portion of the glass capillary tube, under low magnification.
Figure 6:
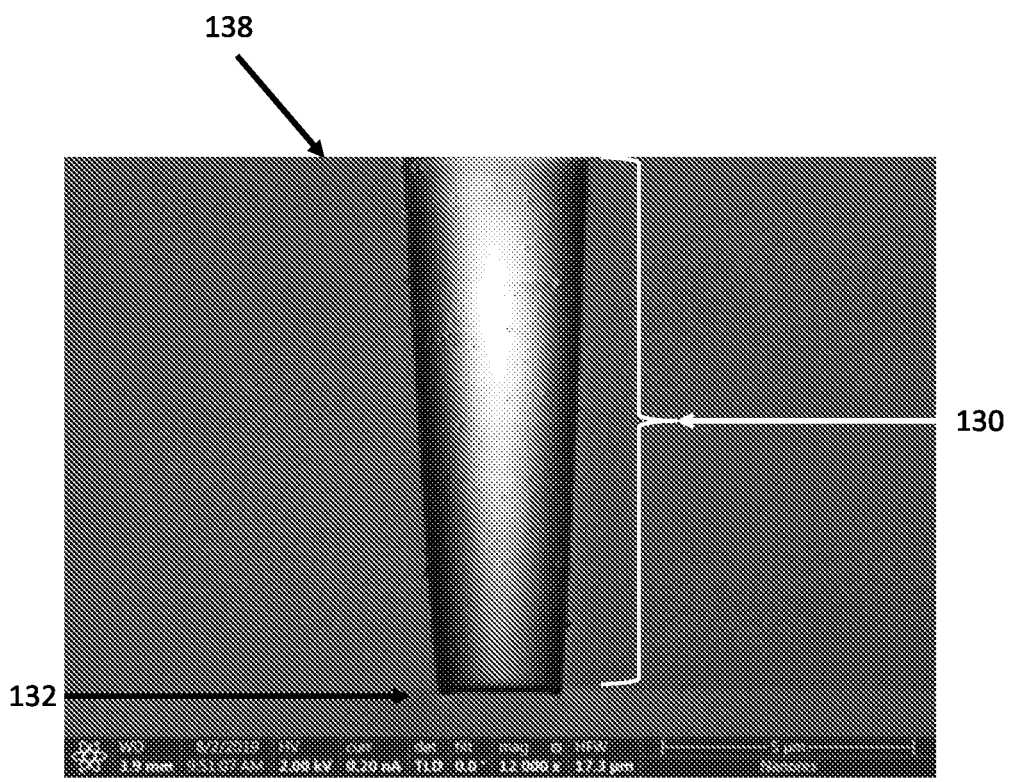
FIG. 6 is a scanning electron microscope (SEM) view of a tapering portion of the glass capillary tube, under high magnification.

The glass capillary tube includes an elongate input portion 128 and a tapering portion 130. There is an externally visible portion 134 of the glass capillary tube 120. Some of the elongate input portion 128 may be obscured by the surrounding plastic handle 122. The tapering portion 130 tapers to an outlet (output end) 132 (having an inner diameter of 0.5 µm and an outer diameter at the tip of 0.7 µm in the case of the certain Femtotips™ II Microinjection Capillary Tips). The reduction of diameter along the tapering portion 130 from the elongate input portion 128 to the outlet 132 is more clearly illustrated in FIGS. 4 through 6. FIG. 4 is a scanning electron micrograph view (formed from stitching together multiple SEM images) of the entire externally visible portion 134 of the glass capillary tube 120. A first magnification region 136 of the tapering portion 130 including the outlet 132, observed under low magnification in a scanning electron microscope (SEM), is shown in FIG. 5. Furthermore, a second magnification region 138 located within the first magnification region 136, observed under high magnification in a scanning electron microscope (SEM), is shown in FIG. 6. The outer diameter is smallest at the outlet 132 (FIG. 6) and increases with increasing longitudinal distance from the outlet 132.

Figure 3:
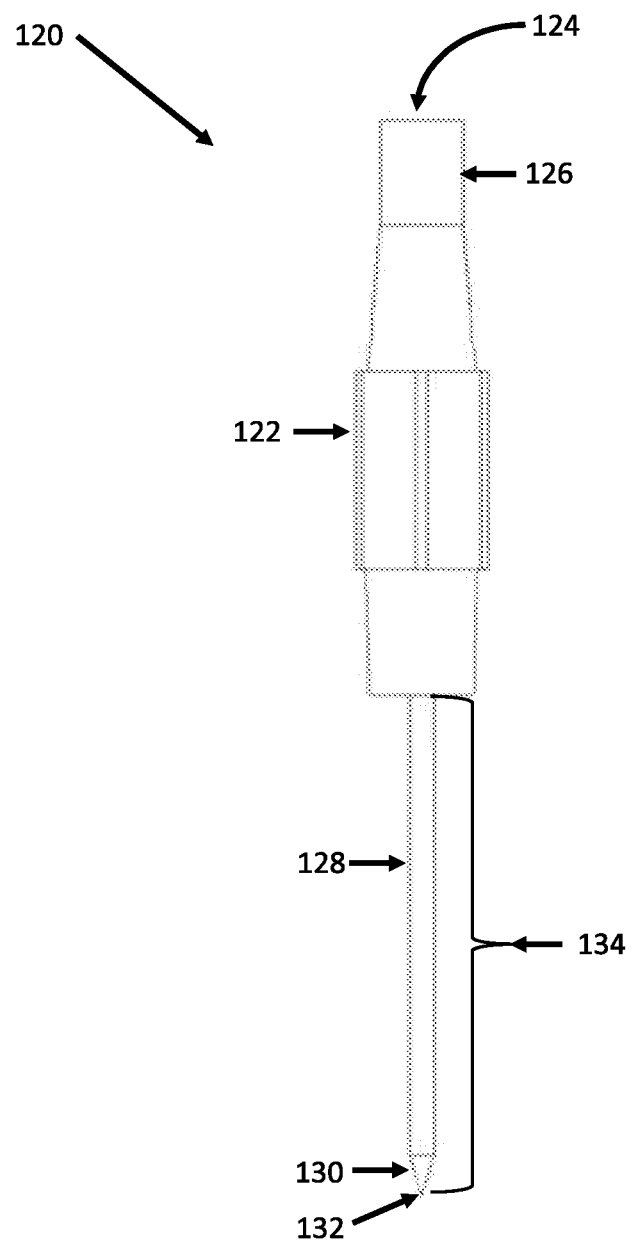
FIG. 3 is a schematic side view of a glass capillary tube.
Figure 7:
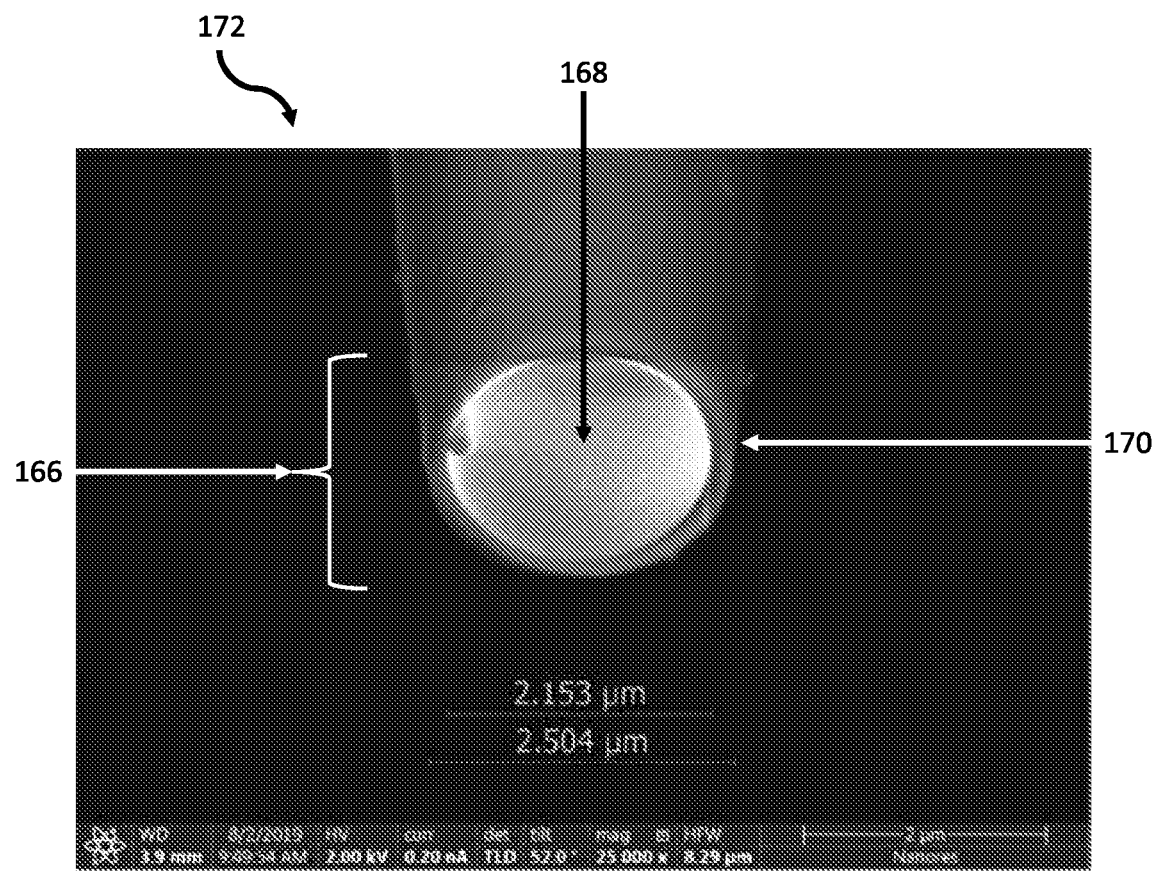
FIG. 7 is a scanning electron microscope (SEM) view of the output portion after focused-ion beam treatment, under high magnification.
Figure 8:
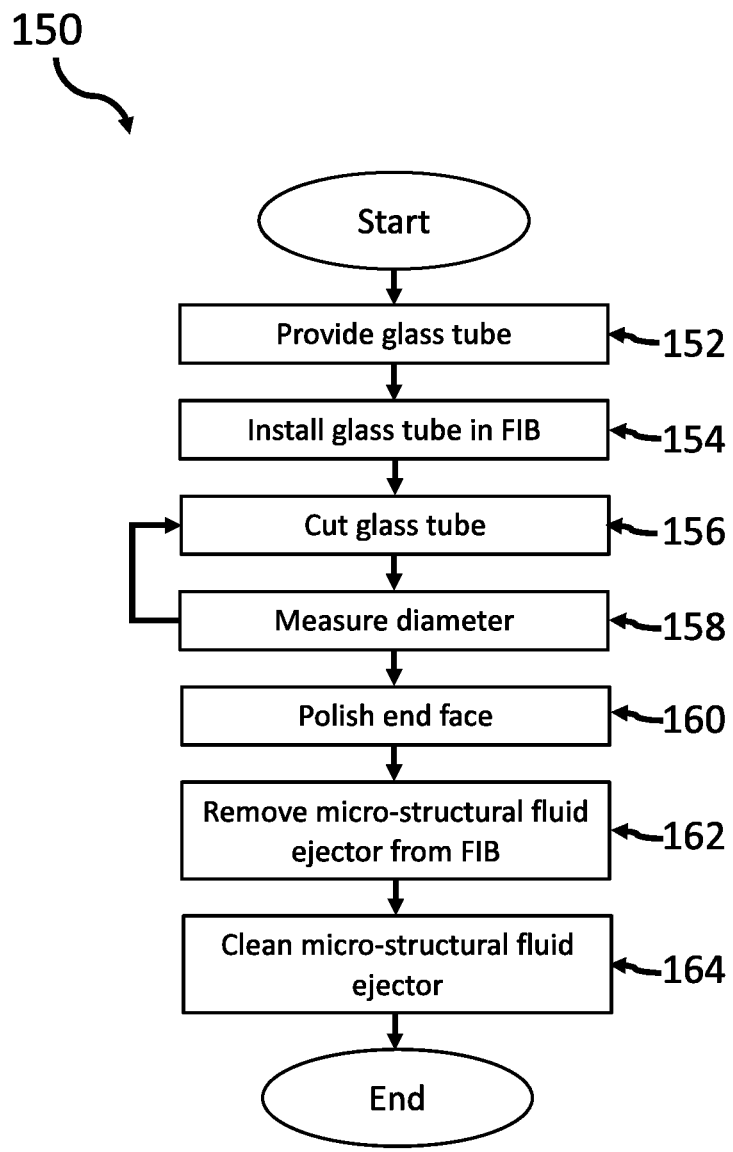
FIG. 8 is a flow diagram of a method of forming a micro-structural fluid ejector.

In many cases it is desirable to increase the size of the outlet (outlet size). It is possible to increase the outlet size by cutting the glass capillary tube 120 at a suitable longitudinal location along the tapering portion 130. This cutting method 150 is explained with reference to FIG. 8. Cutting may be done using a focused-ion beam (FIB) apparatus. At step 152, a glass capillary tube 120, such as shown in FIG. 3 is provided. At step 154, the glass capillary tube is installed in a focused-ion beam (FIB) apparatus. For example, a plasma-source Xe⁺ FIB (also called PFIB) is used. At step 156, a longitudinal location along the tapering portion 130 is selected, and the focused ion beam is directed to it, with sufficient energy density for cutting the glass tube. At step 156, a cut is made using the focused-ion beam across the tapering portion at the selected longitudinal location. After the previous step 156 is completed, a scanning electron microscope (in the FIB apparatus) is used to measure the outer diameter or inner diameter or both at the tip (step 158). If the measured inner diameter or outer diameter or both are too small, step 156 is carried out at another longitudinal location along the tapering portion, and step 158 is carried out. Steps 156 and 158 are repeated until the desired outlet size is obtained. As shown in FIG. 7, the final cutting (final iteration of step 156) defines a (finalized) outlet 166 including the exit orifice 168 and the end face 170. Herein, a finalized outlet 166 means an outlet that has been cut and polished according to the method 150 (FIG. 8). In the example shown in FIG. 7, the outlet inner diameter is measured to be 2.153 µm and the outlet outer diameter is measured to be 2.504 µm. We refer to the outlet outer diameter as the outlet size. For glass capillary tubes 120, outlet sizes in a range of 700 nm to 40 µm, or outlet sizes in a range of 700 nm to 5 µm are possible, and these outlet sizes can be used in the current printing (dispensing) methods.

Then, at step 160, the energy of the focused ion beam is reduced, and the focused ion beam is directed to the end face 170. The end face 170 is polished using the focused ion beam, to obtain an end face with a surface roughness of less than 0.1 µm, and preferably ranging between 1 nm and 20 nm. In the end face example shown in FIG. 7, it can be deduced from the outer and inner diameter dimensions that the end face has a surface roughness of less than 0.1 µm. When the polishing capability of the FIB apparatus is taken into account, it is considered likely that the surface roughness of the end face ranges between 1 nm and 20 nm. Upon the conclusion of step 160, a micro-structural fluid ejector (nozzle) 200 is obtained. Then, at step 162, the micro-structural fluid ejector 200 is removed from the FIB apparatus. Additionally, it is preferable to clean the micro-structural fluid ejector, particularly the output portion, by immersion in a solvent while applying pressure in the range of 0.1 bar (10,000 Pa) to 10 bar (1,000,000 Pa) (step 164). We have found it effective to use a solvent that is identical to a solvent used in the printing fluid. For example, if the printing fluid contains propylene glycol, it is found effective to use propylene glycol as a solvent for cleaning in this step 164. The foregoing is a description of an example of a micro-structural fluid ejector obtained by modification of a glass capillary tube. More generally, it is contemplated that micro-structural fluid ejector can be obtained from other materials, such as plastics, metals, and silicon, or from a combination of materials. Upon completion of step 162 and/or step 164, the micro-structural fluid ejector is ready to use.

Commercially available stainless-steel needles can be used as nozzles. For example, stainless-steel needles called NanoFil™ Needles, are available from World Precision Instruments. Needle part numbers NF35BL-2 and NF36BL-2 have been used. A side view of stainless-steel needle 30 is shown schematically in FIG. 9. Needle 30 has an inlet 36, which is attached to a syringe during operation, an outlet 38, and an elongate fluid passageway portion 40 between the inlet 36 and outlet 38. The fluid passageway portion 40 includes a shank portion 32, which includes the inlet 36, and a tip portion 34, which includes the outlet 38. A length 42 of the shank portion is 30 mm and an outer diameter 46 of the shank portion is 460 µm. A length 44 of the tip portion is 5 mm (for NF35BL-2) or 3 mm (for NF36BL-2). FIG. 10 is a bottom schematic view of the tip portion 34, showing outlet 38 in greater detail. The needle tip portion 34 has an outer wall 52, characterized by an outer diameter 62, and an inner wall 54, characterized by an inner diameter 64. The outer diameter 62 is 135 µm (for NF35BL-2) or 120 µm (for NF36BL-2). The inner diameter 64 is 55 µm (for NF35BL-2) or 35 µm (for NF36BL-2). The outer diameter 62 of the tip portion 34 is sometimes referred to as the outlet size. For needles 30, outlet sizes are preferably in a range of 100 µm to 150 µm.

Figure 11:
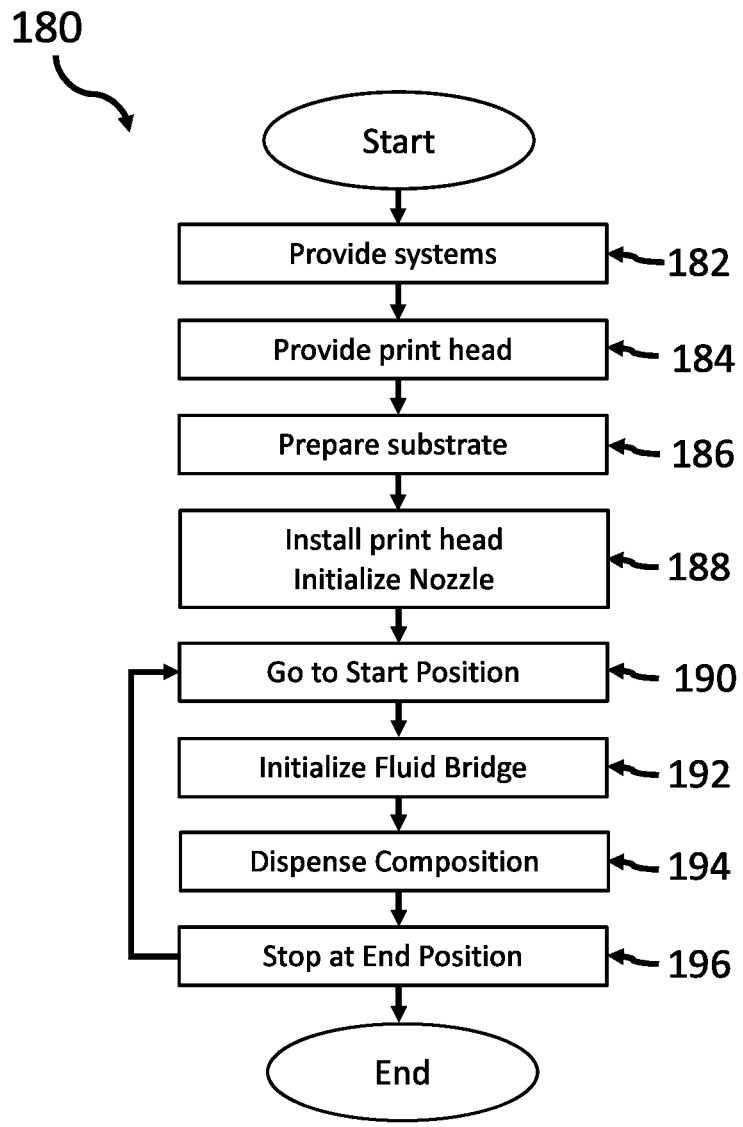
FIG. 11 is a flow diagram of a printing method according to a first embodiment.
Figure 12:
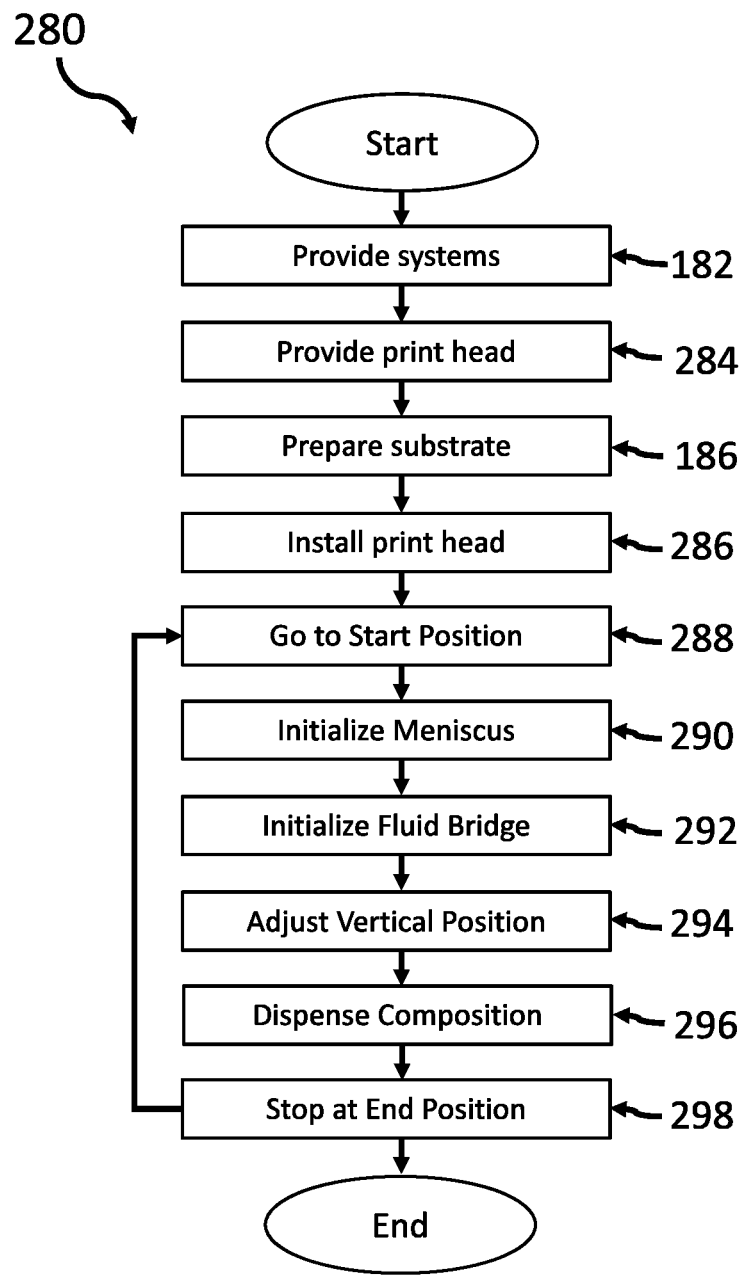
FIG. 12 is a flow diagram of a printing method according to a second embodiment.

FIGS. 11 and 12 are flow diagrams of printing methods according to a first embodiment and second embodiment, respectively. For example, the method shown in FIG. 11 uses a micro-structural fluid ejector, as the nozzle 200. The making of the micro-structural fluid ejector from a glass capillary tube has been explained with reference to FIG. 8. The FIG. 11 method has been used to dispense silver nanoparticle compositions (Examples 5, 6, 7, 8, and 10) and examples of silver nanoparticle printed features are shown in FIGS. 14, 15, 16, 17, 18, 19, and 22. The FIG. 11 method can also be used to dispense other metallic nanoparticle compositions, including copper nanoparticle compositions.

Figure 20:
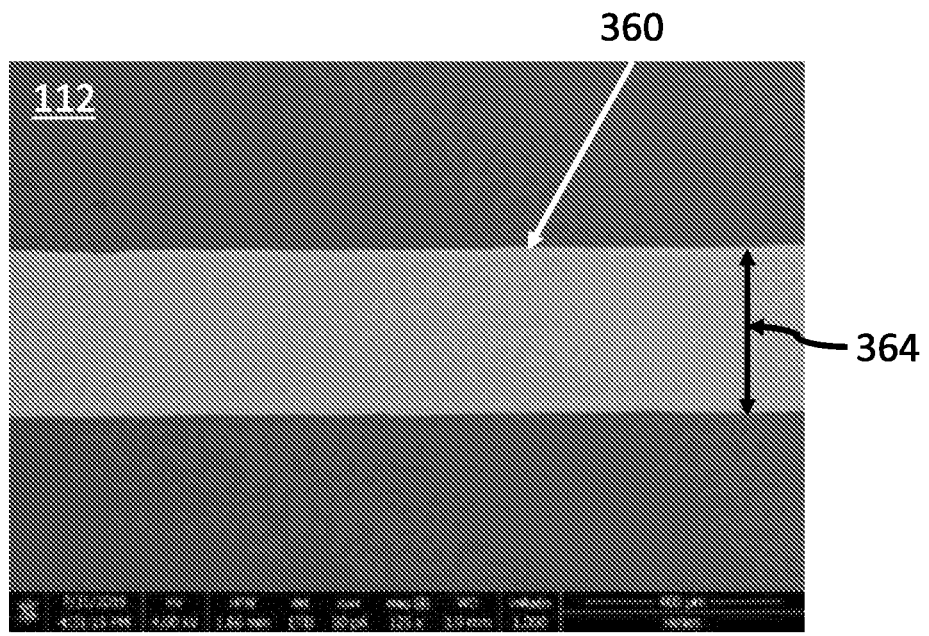
FIG. 20 is a scanning electron microscope (SEM) view of a printed copper nanoparticle feature having a line width of approximately 350 μm.
Figure 21:
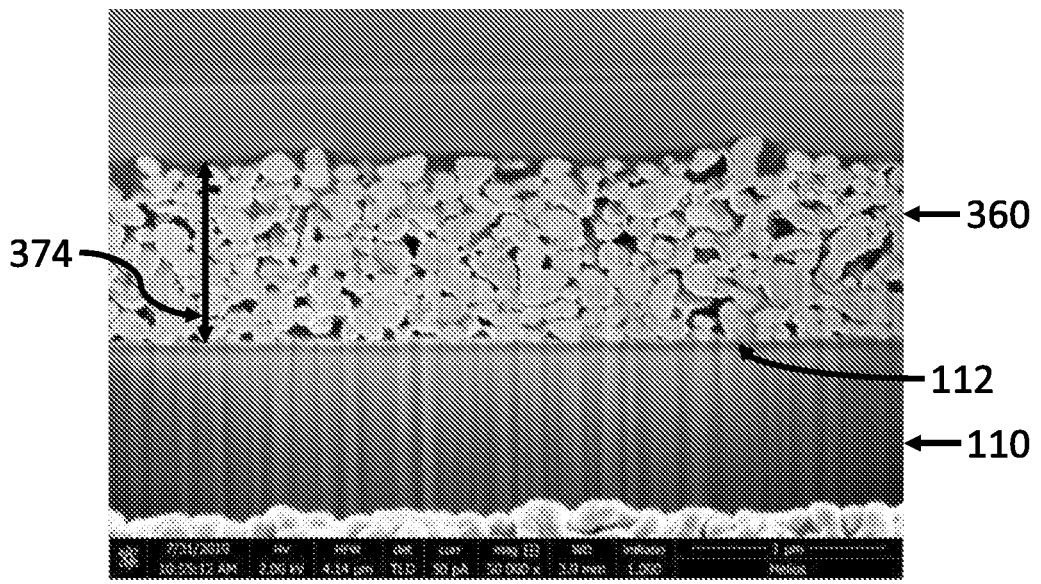
FIG. 21 is scanning electron microscope (SEM) view of a cross section of the printed copper nanoparticle feature of FIG. 20.

For example, the method shown in FIG. 12 uses a stainless-steel needle (FIGS. 9 and 10), as the nozzle 200. The FIG. 12 method has been used to dispense copper nanoparticle compositions (Examples 1, 2, 3, 4, and 9) and an example of copper nanoparticle printed feature is shown in FIGS. 20 and 21. The FIG. 12 method can be used to dispense other metallic nanoparticle compositions, including silver nanoparticle compositions.

FIG. 11 is a flow diagram of a dispensing method 180, in which a fluid printing apparatus is operated (FIG. 2). Method 180 corresponds to step 16 of FIG. 1. At step 182, systems in the fluid printing apparatus 100, including a substrate stage 102, a pneumatic system 106, a print head positioning system 108, and an imaging system 114, are provided. At step 184, a print head 104 is provided. For example, this includes preparing a micro-structural fluid ejector according to method 150 (FIG. 8) for use as a nozzle 200. At step 186 the substrate 110 is prepared, which includes positioning the substrate at an appropriate position on the substrate stage in the fluid printing apparatus 100. Step 186 may optionally include cleaning the substrate.

Figure 13:
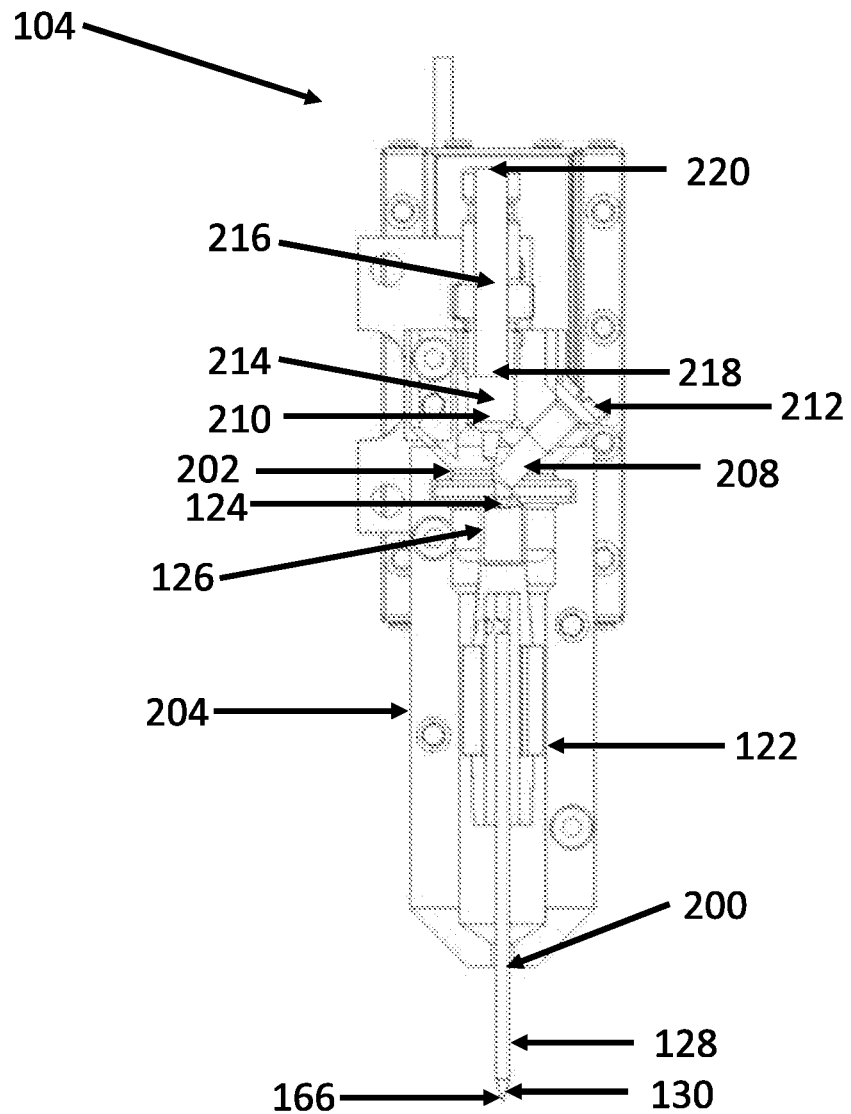
FIG. 13 is a cut-away schematic side view of a print head.

An example of a print head 104 is shown in FIG. 13. The print head 104 includes a micro-structural fluid ejector (nozzle) 200. A portion of the nozzle 200, and its plastic handle 122, are encased in the external housing 204. The elongate input portion 128 extends downward from the external housing 204. An outlet 166, including the exit orifice 168 and end face 170 (FIG. 7), are located downward (downstream) from the elongate input portion 128. The tapering portion 130 is located between the outlet 166 and the elongate input portion 128. The external housing 204 encases a main body 202, which includes a pneumatic conduit 210 and a fluid conduit 208. Both the pneumatic conduit 210 and the fluid conduit 208 are connected to the inlet 124 of the plastic handle 122. The plastic handle 122 is attached to the main body 202 by the threaded portion 126 of the plastic handle 122. The pneumatic conduit 210 has a threaded portion 214 on its input end which is used to attach the output end 218 of a pneumatic connector 216 thereto. The pneumatic connector 216 has an input end 220 to which the pneumatic system 106 is connected (not shown in FIG. 13). Fluid (for example, a nanoparticle composition) is supplied to the nozzle 200 via the fluid conduit 208. As shown in FIG. 13, fluid conduit 208 is plugged with a fluid inlet plug 212, after fluid has been supplied to the nozzle 200. The nanoparticle composition can be stored in the nozzle 200 in the print head 104, or the nanoparticle composition can be stored in a fluid reservoir that supplies ink to the print head 104 via the fluid conduit 208.

Step 188 (FIG. 11) includes installing the nozzle in the print head 104 above the substrate 110 with the outlet 166 pointing down toward the substrate 110. Step 188 additionally includes providing a supply of the metallic nanoparticle composition made at step 14 (FIG. 1) in the nozzle 200. This is accomplished by transferring the nanoparticle composition to the nozzle 200. Step 188 additionally includes coupling a pneumatic system 106 to the print head 104. Typically, the pneumatic system 106 includes a pump and a pressure regulator. The pneumatic system 106 may be capable of applying pressure in a range of 0 to 6 bar to the inlet of the nozzle. Typically, a pressure (an initial pressure) in a range of 1 bar to 3 bar, or 1.5 bar to 3 bar, or 2 bar to 3 bar, is applied to the nanoparticle composition in the nozzle. Under the initial pressure, the nanoparticle composition flows out from the outlet. During this step 188, the outlet is at a height sufficiently above the printable surface 112 of the substrate 110 that the nanoparticle composition does not flow onto the substrate. Instead, the nanoparticle composition accumulates on the end face 170 and the outer wall of the glass capillary tube. Such a height is not particularly limited, but could be 100 μm or more, 500 μm or more, or 1 mm or more, as long as the nanoparticle composition does not flow onto the substrate.

The print head positioning system 108 controls the vertical displacement of the print head 104 and the lateral displacement of the print head 104 relative to the substrate. At step 190, the print head is moved to the start position. At step 190, the print head positioning system 108 is operated to laterally displace the print head 104 relative to the substrate 110. The lateral displacement of the print head relative to the substrate means one of the following options: (1) the substrate is stationary and the print head is moved laterally; (2) the print head is not moved laterally and the substrate is moved laterally; and (3) both the print head and the substrate are moved laterally. The print head positioning system 108 includes a lateral positioner and a vertical positioner. Generally, the vertical positioner is coupled to the print head. In option (1), the lateral positioner is also coupled to the print head and the print head is moved laterally and vertically. In option (2), the lateral positioner is coupled to the substrate stage. In option (3), there is a first lateral positioner coupled to the substrate stage and a second lateral positioner coupled to the print head. For example, the first lateral positioner could be used for coarse movement and the second lateral positioner could be used for fine movement.

Additionally, at step 190, the print head positioning system 108 vertically displaces the nozzle to the start position. Typically, at the start position, the outlet 166 is in a range of 5 μm to 15 μm above the printable surface 112 of the substrate 110. Typically, the nozzle is lowered to this start position. The nozzle can be lowered toward the start height in steps of 1.0 μm. This start height (start position) is selected such that the nanoparticle composition does not flow onto the substrate. At step 190, a pressure sufficient for the nanoparticle composition to continue to flow is applied. Typically, a pressure in a range of 1.0 bar to 2.0 bar, or 1.0 bar to 1.5 bar, is applied to the nanoparticle composition in the nozzle.

Step 192 is carried out after step 190. At step 192, a fluid bridge between the outlet 166 and printable surface 112 of the substrate 110 is formed. In this case, a fluid bridge is a bridge formed by the nanoparticle composition. A fluid bridge can be formed by lowering the nozzle toward the substrate to an adjusted height such that the fluid (nanoparticle composition) protruding from the outlet comes into contact with the substrate. The nozzle can be lowered toward the substrate in steps of 0.25 μm. It is possible that the nozzle is lowered toward the substrate such that the outlet comes into direct contact with the substrate. However, in such case, the nozzle should subsequently be raised such that the outlet is no longer in direct contact with the substrate. For example, the nozzle can be raised by a vertical distance in a range of 0.25 μm to 1.0 μm upon detection of a direct contact between the outlet and the substrate. For example, the imaging system 114 can be configured to detect the nozzle coming into direct contact with the substrate, by detecting a bending or change in shape of the nozzle or a reflection of the nozzle from the surface of the substrate. The adjusted height, measured as height of the outlet 166 above the printable surface 112 of the substrate 110, is preferably 50 nm or greater. In all cases, during step 192, the outlet is lowered from the initial height toward the substrate such that a fluid bridge forms between the outlet and the substrate and the outlet is not in direct contact with the substrate.

In addition, at step 192, an adjusted pressure is applied to the nanoparticle composition in the nozzle while the nozzle is lowered toward the substrate. It has been found that this adjusted pressure is preferably lower than needed for the composition to continue to flow from the outlet. Typically, the adjusted pressure is in a range of 10 mbar to 200 mbar.

Step 194 is carried out after step 192. At step 192, the nanoparticle composition is dispensed onto the substrate 110 from the nozzle 200, while the print head 104 is laterally displaced relative to the substrate 110 from the start position to the end position along a trajectory. For example, a speed of lateral displacement during this step 192 is 0.01 mm/sec. During this step 192, the pressure applied to the composition in the nozzle is referred to as the dispensing pressure. The dispensing pressure should be sufficient to dispense the composition onto the substrate. It has been found that this dispensing pressure is preferably less than or equal to the adjusted pressure, selected at step 192 to be lower than needed for the composition to continue to flow from the outlet. Typically, the dispensing pressure is in a range of 0 mbar to 100 mbar. The dispensing is carried out without the application of electric fields to the nanoparticle composition. During the dispensing of the nanoparticle composition (lateral displacement of the nozzle), the outlet may continue to be at the adjusted height above the substrate. In that case, it may be possible for the nozzle to traverse steps with heights that are not as tall as the adjusted height.

At step 196, lateral displacement of the print head 104 relative to the substrate 110 is complete at the end position. The nozzle 200 is raised away from the substrate 110 and a higher pressure is applied to the composition in the nozzle. Typically, a pressure in a range of 1.0 bar to 2.0 bar, or 1.0 bar to 1.5 bar, is applied to the nanoparticle composition in the nozzle. Typically, the nozzle 200 is lifted such that the outlet 166 is at least 5 µm above the printable surface 112 of the substrate 110. In order to carry out multiple iterations of printing, steps 190, 192, 194, and 196 are repeated until all of the desired iterations have been completed. Multiple iterations can be used to form multiple printed features at different locations on a substrate or to form a single printed feature of greater thickness and/or line width.

FIG. 12 is a flow diagram of a dispensing method 280, in which a fluid printing apparatus is operated (FIG. 2). Method 280 corresponds to step 16 of FIG. 1. At step 182, systems in the fluid printing apparatus 100 are provided, as explained for FIG. 11. At step 284, a print head 104 is provided. This includes providing a stainless-steel needle (FIGS. 9 and 10) to be used as the nozzle 200. At step 186 the substrate 110 is prepared, as explained for FIG. 11.

Step 286 (FIG. 12) includes installing the nozzle in the print head 104 above the substrate 110 with the outlet 38 of needle 30 pointing down toward the substrate 110. It is preferable that the needle 30 be tilted, at an angle (tilt angle) within a range of 30° to 60°, or at an angle within a range of 40° to 60°, relative to the vertical. Step 286 additionally includes providing a supply of the metallic nanoparticle composition made at step 14 (FIG. 1) in the nozzle 200. This is accomplished by transferring the nanoparticle composition to the nozzle 200. Optionally, pneumatic system 106 can be coupled to the print head 104 at this step 286. However, no pressure is applied to the nanoparticle composition at step 286, and accordingly there is no flow of the nanoparticle composition from the outlet. Typically, the pneumatic system 106 includes a pump and a pressure regulator. The pneumatic system 106 may be capable of applying pressure in a range of 0 to 6 bar to the inlet of the nozzle. During this step 286, the outlet is at a height sufficiently above the substrate to provide a safe clearance between the nozzle and the substrate. Such a height is not particularly limited, but could be 100 µm or more, 500 µm or more, or 1 mm or more.

At step 288, the print head is moved to the start position by operation of the print head positioning system 108. At step 290, the meniscus is initialized. Step 290 is carried out with the outlet 38 positioned at an initial height about the printable surface 112 of the substrate 110. This initial height is preferably in a range of 30 µm to 80 µm. For example, the initial height is approximately 50 µm. The nozzle is displaced to the initial height either in step 288 or step 290.

The coupling of the pneumatic system 106 to the print head 104 is carried out in step 288 or step 290. At step 290, an initial pressure is applied to the composition in the nozzle, with the outlet 38 positioned at the initial height above the substrate, to cause a meniscus to protrude downward from the outlet toward the substrate. The initial pressure is preferably in a range of 25 mbar to 100 mbar. For example, the initial pressure is approximately 75 mbar.

Step 292 is carried out after step 290. At step 292, a fluid bridge between the outlet 38 and printable surface 112 of the substrate 110 is initialized. In this case, a fluid bridge is a bridge formed by the nanoparticle composition. At step 292, an intermediate pressure is applied to the nanoparticle composition in the nozzle. Preferably, the intermediate pressure is in a range of 10 mbar to 50 mbar. For example, the intermediate pressure is approximately 25 mbar. A fluid bridge can be formed by lowering the nozzle toward the substrate to an intermediate height such that the meniscus (nanoparticle composition) protruding from the outlet comes into contact with the substrate. The intermediate height, measured as the height of the outlet 38 above the printable surface 112 of the substrate 110, is preferably in a range of 1 µm to 5 µm. A fluid bridge forms between the outlet and the substrate, but the outlet is not in direct contact with the substrate.

Step 294 is carried out after step 292. At step 294, the vertical position of the nozzle is adjusted as follows. The nozzle is raised such that the outlet 38 is at an adjusted height above the printable surface 112 of substrate 110. The adjusted height is greater than the intermediate height and is chosen such that the fluid bridge remains in contact with the outlet and the substrate. Preferably, the adjusted height is greater than the intermediate height by a height difference ranging between 10 µm and 20 µm. At step 294, the outlet is positioned at the adjusted height and an adjusted pressure is applied to the nanoparticle composition in the nozzle, such that the fluid bridge remains in contact with the outlet and the substrate. Preferably, the adjusted pressure is in a range of 10 mbar to 50 mbar. For example, the adjusted pressure is approximately 25 mbar.

Step 296 is carried out after step 294. At step 296, the nanoparticle composition is dispensed onto the substrate 110 from the nozzle 200, while the print head 104 is laterally displaced relative to the substrate 110 from the start position to the end position along a trajectory. During this step 296, the pressure applied to the composition in the nozzle is referred to as the dispensing pressure. Preferably, the dispensing pressure is in a range of 10 mbar to 50 mbar. For example, the dispensing pressure is approximately 25 mbar. The dispensing is carried out without the application of electric fields to the nanoparticle composition. It is preferable that the needle 30 be tilted at a tilt angle relative to the vertical. Preferably, the direction of tilt is transverse to, or not parallel to, the direction of lateral displacement of the nozzle along the trajectory on the substrate. As a result of the tilt, the line width of the printed feature is smaller than it would be if the nozzle were not tilted. During the dispensing of the nanoparticle composition (lateral displacement of the nozzle), the outlet 38 may continue to be at the adjusted height above the substrate. In that case, it may be possible for the nozzle to traverse steps with heights that are not as tall as the adjusted height.

At step 298, lateral displacement of the print head 104 relative to the substrate 110 is complete at the end position. The nozzle 200 is raised away from the substrate 110 and pressure is turned off. Typically, the nozzle 200 is lifted such that the outlet 166 is at least 30 μm above the printable surface 112 of the substrate 110. In order to carry out multiple iterations of printing, steps 288, 290, 292, 294, 296, and 298 are repeated until all of the desired iterations have been completed.

An application of metallic nanoparticle compositions is open defect repair. A discontinuity in a conductive feature is referred to as an open defect. An open defect is located between a first conductive feature and a second conductive feature. In the absence of the open defect, there would have been one continuous conductive feature instead of the first and second conductive features. One can attempt to repair the open defect by adding a new conductive feature extending between the first conductive feature and the second conductive feature. This newly added conductive feature can be referred to as a repair feature. In an open defect repair (ODR) operation, the metallic nanoparticle composition is dispensed from the nozzle while the print head is laterally displaced relative to the substrate along a trajectory between the first conductive feature and the second conductive feature in one or more iterations.

Figure 14:
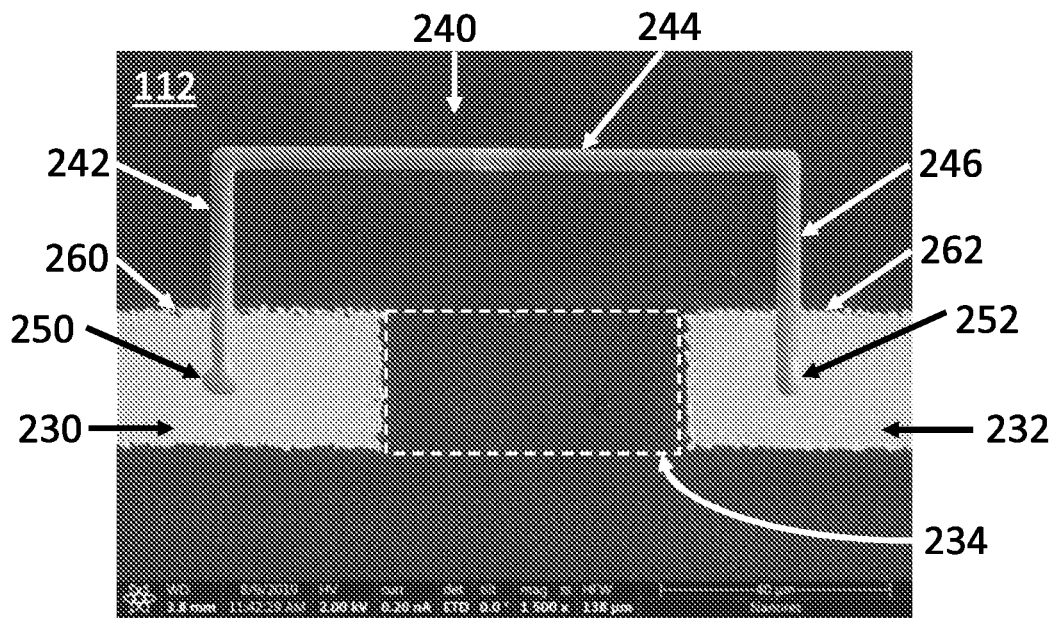
FIG. 14 is a scanning electron microscope (SEM) view of a printed silver nanoparticle feature having a line width of approximately 3.7 μm.

In FIG. 14, a portion of a printable surface 112 of a glass substrate 110 is visible. A first conductive feature 230 and a second conductive feature 232 are visible on the printable surface 112. In this example, a gold layer was sputtered on the glass substrate and patterned by laser ablation to form the test pattern (including the conductive features 230, 232). The open defect 234 (shown bounded by dashed lines, located between the first conductive feature 230 and the second conductive feature 232) represents a region where a conductive feature was intended but not formed.

FIG. 14 shows a repair feature 240, comprising silver nanoparticles, formed between the conductive features (230, 232). The repair feature 240 has been formed using a metallic nanoparticle composition according to Example 7: containing silver nanoparticles (at a concentration of 56 wt %), a first solvent of propylene glycol, and a second solvent of glycerol (at a concentration of 4.6 wt %). The repair feature 240 has a line width of about 3.7 μm and a thickness of about 410 nm. The repair feature consists of three segments (242, 244, 246) between a left end point 250 on the first conductive feature 230 and a right end point 252 on the second conductive feature 232.

The nanoparticle composition is dispensed in multiple iterations to form the repair feature 240, according to method 180 (FIG. 11). In the case shown in FIG. 14, the repair feature 240 has been formed in 4 iterations. In the each iteration, the metallic nanoparticle composition is dispensed according to the following trajectory: (1) start at end point 250 on the first conductive feature 230; (2) move away from the first conductive feature 230 along segment 242; (2) change direction and move rightward along segment 244; (3) change direction and move along segment 246 toward the second conductive feature 232; (4) end at end point 252 on the second conductive feature 232. Accordingly, the repair feature 240 does not traverse the open defect region 234.

Figure 15:
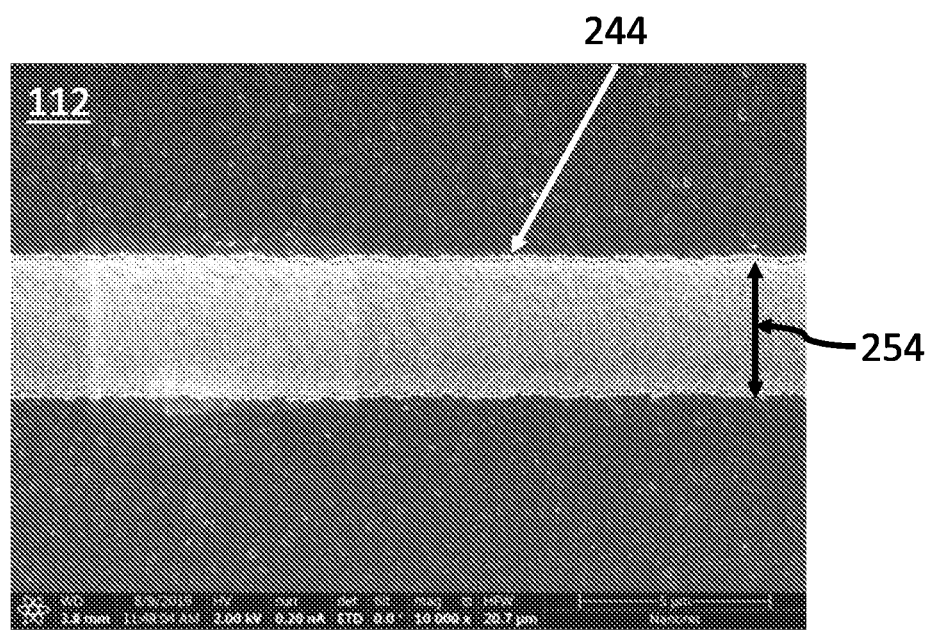
FIGS. 15, 16, and 17 are scanning electron microscope (SEM) view of portions of the printed silver nanoparticle feature of FIG. 14.
Figure 16:
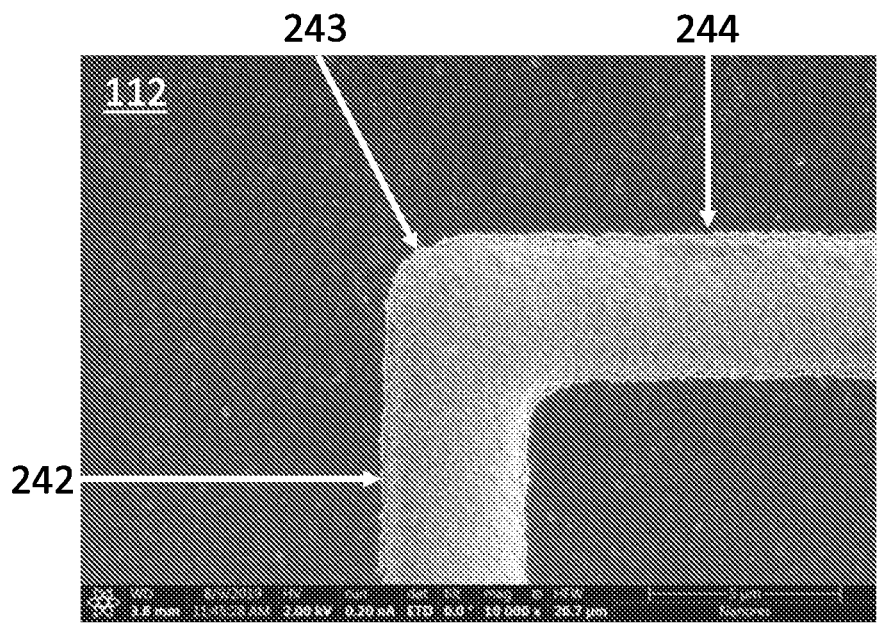

FIG. 15 shows a portion of the second repair feature segment 244 at greater magnification. The line width 254 is approximately 3.7 μm. The dispensed line is highly homogeneous and line width uniformity is excellent. FIG. 16 shows a portion of the repair feature 240 at greater magnification, including a region where first repair feature segment 242 and the second repair feature segment 244 meet at a vertex 243. The dispensed line is highly homogeneous and line width uniformity is excellent, even though there is a change in direction of the trajectory of the nozzle at vertex 243.

Figure 17:
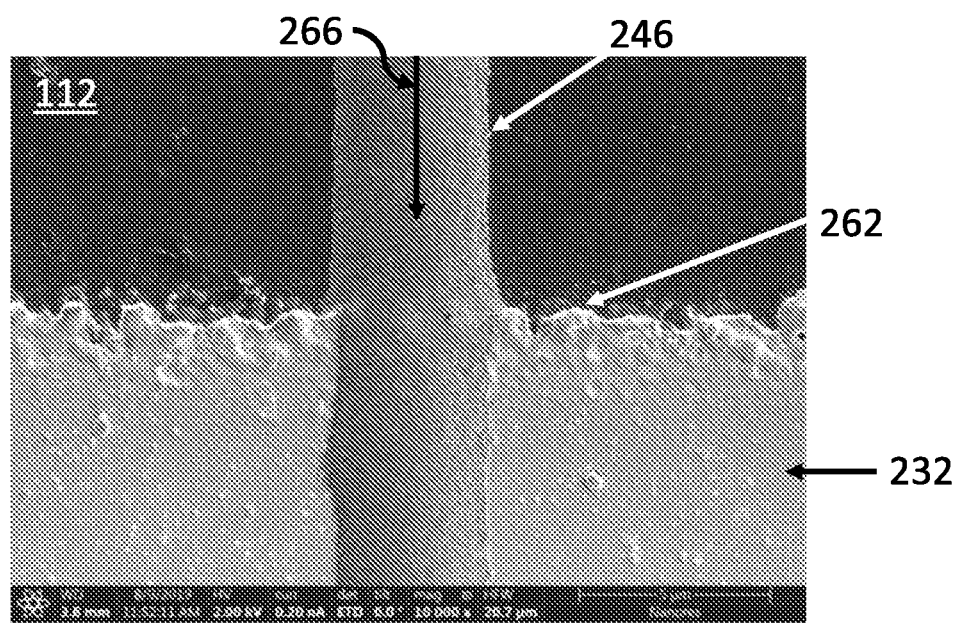

As can be seen in FIG. 14, the trajectory of the nozzle along segment 242 traverses an edge 260 of the first conductive feature (gold feature) 230, and the trajectory of the nozzle along segment 246 traverse an edge 262 of the second conductive feature (gold feature) 232. The thickness of the conductive feature (gold feature) is in a range of 150 nm to 250 nm. Since the trajectory begins at end point 250 and ends at end point 252, the step at edge 260 is a downward step and the step at edge 262 is an upward step. FIG. 17 shows a portion of the third repair feature segment 246 at greater magnification, including a region where the third repair feature trajectory crosses the conductive feature edge 262. A direction of the trajectory of the nozzle is shown as arrow 266. Accordingly, the nozzle traverses an upward step at edge 262 of the second conductive feature 232. Nevertheless, the homogeneity of the repair feature segment 246 at the upward step is excellent.

Figure 18:
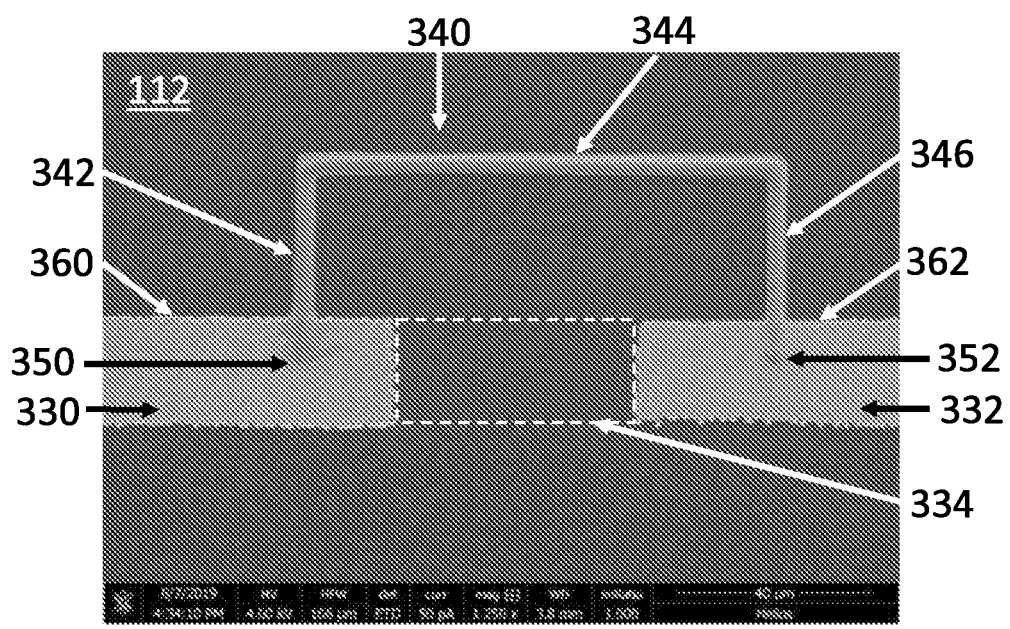
FIG. 18 is a scanning electron microscope (SEM) view of a printed silver nanoparticle feature having a line width of approximately 4.5 μm.

The repair feature shown in FIG. 18 is similar to that of FIG. 14 except that the nanoparticle composition contained no glycerol. The repair feature 340 has been formed using a metallic nanoparticle composition according to Example 8: containing silver nanoparticles (at a concentration of 57 wt %), a first solvent of propylene glycol, and no second solvent. In FIG. 18, a portion of a printable surface 112 of a glass substrate 110 is visible. A first conductive feature 330 and a second conductive feature 332 are visible on the printable surface 112. The conductive features 330, 332 are similar to the conductive features 230, 232 of FIG. 14. The open defect 334 (shown bounded by dashed lines, located between the first conductive feature 330 and the second conductive feature 332) represents a region where a conductive feature was intended but not formed.

FIG. 18 shows a repair feature 340, comprising silver nanoparticles, formed between the conductive features (330, 332). The repair feature 340 has a line width of about 4.5 μm and a thickness of about 570 nm. The dispensed line appears to be highly homogeneous and line width uniformity is excellent. The repair feature consists of three segments (342, 344, 346) between a left end point 350 on the first conductive feature 330 and a right end point 352 on the second conductive feature 332.

Figure 19:
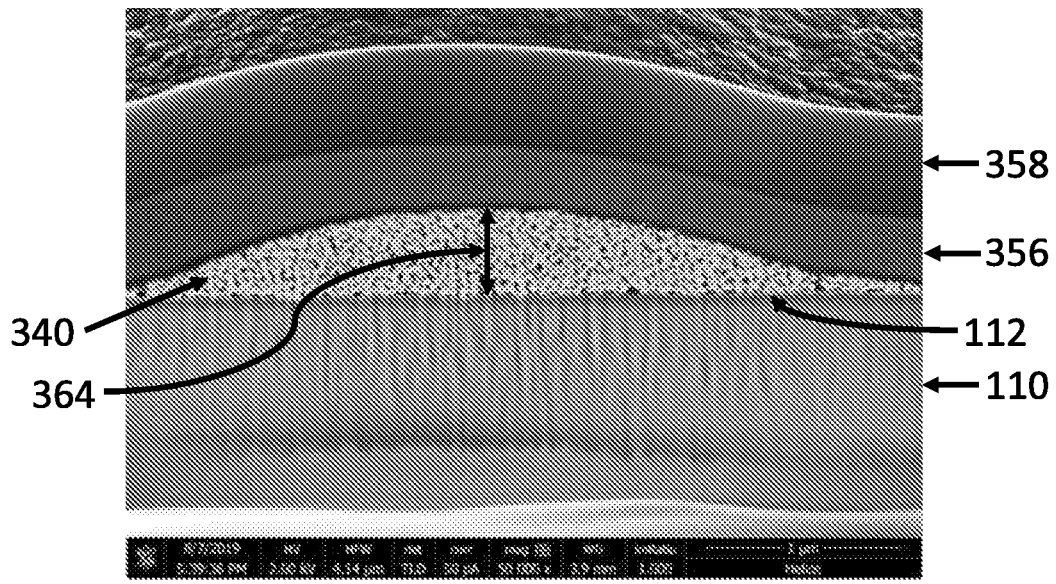
FIG. 19 is a scanning electron microscope (SEM) view of a cross section of the printed silver nanoparticle feature of FIG. 18.

The nanoparticle composition is dispensed in multiple iterations to form the repair feature 340, according to method 180 (FIG. 11). In the case shown in FIG. 18, the repair feature 340 has been formed in 4 iterations. In the each iteration, the metallic nanoparticle composition is dispensed according to the following trajectory: (1) start at end point 350 on the first conductive feature 330; (2) move away from the first conductive feature 330 along segment 342; (2) change direction and move rightward along segment 344; (3) change direction and move along segment 346 toward the second conductive feature 332; (4) end at end point 352 on the second conductive feature 332. Accordingly, the repair feature 340 does not traverse the open defect region 334. The nozzle has traversed a downward step at conductive feature edge 360 and an upward step at conductive feature edge 362. The traversed step height is the thickness of the conductive feature, in a range of 150 nm to 250 nm. Nevertheless, the homogeneity of the repair feature 340 is excellent. FIG. 19 shows a cross sectional view of the repair feature 340. Repair feature 340 has a maximum thickness 364 of about 570 nm.

Figure 22:
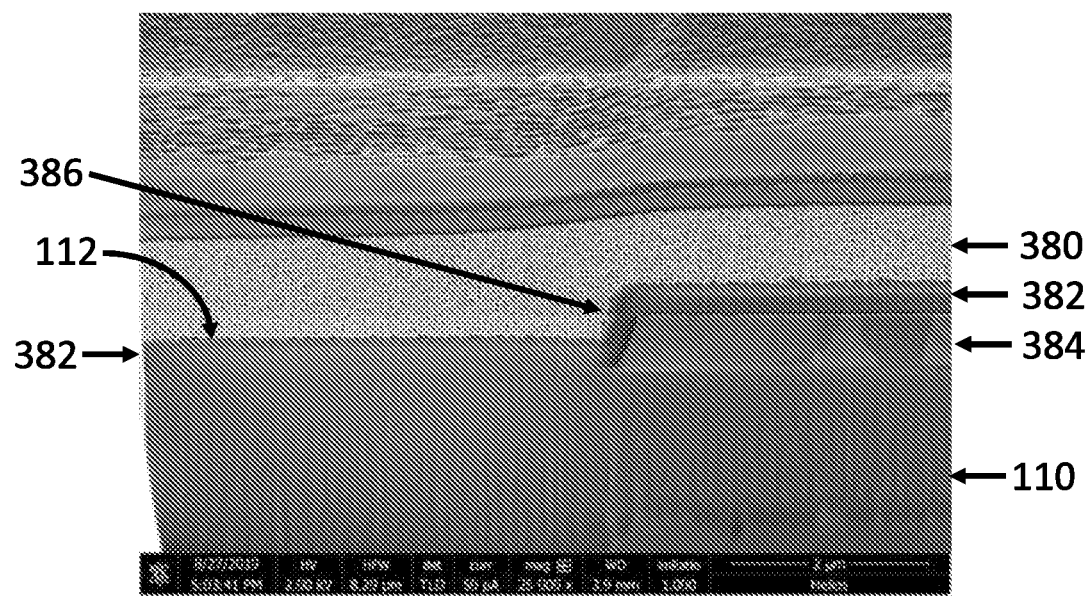
FIG. 22 is scanning electron microscope (SEM) view of a cross section of another printed silver nanoparticle feature.

FIG. 22 is a cross-sectional view of another conductive feature 380 that was formed using a silver nanoparticle composition according to Example 11: containing silver nanoparticles (at a concentration of 55 wt %), a first solvent of propylene glycol, and no second solvent. The nanoparticle composition was dispensed according to method 180 (FIG. 11). A glass substrate 110 has a copper electrode feature 384 formed thereon. A silicon nitride layer 382 has been formed over the entire surface, including the copper electrode feature. Accordingly, the printable surface 112 is the exposed surface of the silicon nitride layer 382. Because of the copper electrode feature 384, there is a step 386 of step height in a range of 500 nm to 550 nm to be traversed during dispensing of the silver nanoparticle composition. Step 386 has been traversed without any breakage in the conductive feature 380. It has been found that method 180 can be used to traverse step heights of up to 750 nm.

Figure 23:
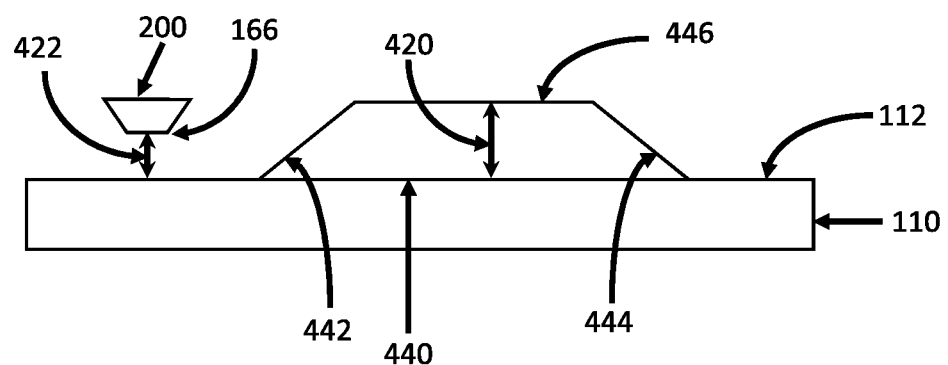
FIG. 23 is a schematic cross-sectional view of a substrate that includes a step.

In the foregoing discussion of dispensing methods 180 (FIG. 11) and 280 (FIG. 12), there has been no discussion of adjusting the nozzle height upward (or downward) along the trajectory on the substrate. These methods 180 and 280 can be modified such that the nozzle is adjusted as the nozzle traverses an upward step or a downward along the trajectory on the substrate. FIG. 23 is a schematic cross-sectional view of a substrate 110 that includes an existing feature 440 that has been formed or deposited on the printable surface 112 of the substrate 110. The existing feature 440 could be a conductive feature, such as a wire. The illustrated cross section may be cutting across a wire perpendicular to its longitudinal direction. The existing feature has a thickness (height) 420 above the substrate 110. A nozzle 200 is positioned above the substrate 110 such that its outlet 166 (or outlet 38 as appropriate) is at a height 422 above the substrate 110. In the example shown, the nozzle height 422 is less than the existing feature thickness 420. If the nozzle continued at height 422, the nozzle would not be able to traverse the existing feature 440. From the standpoint of the nozzle 200, existing feature 440 consists of an upward step 442 (an upward slope), a plateau 446 at a height 420, and a downward step 444. An imaging system 114 (FIG. 2) can be configured to detect the presence of, and measure the dimensions of, the existing feature 440.

Figure 24:
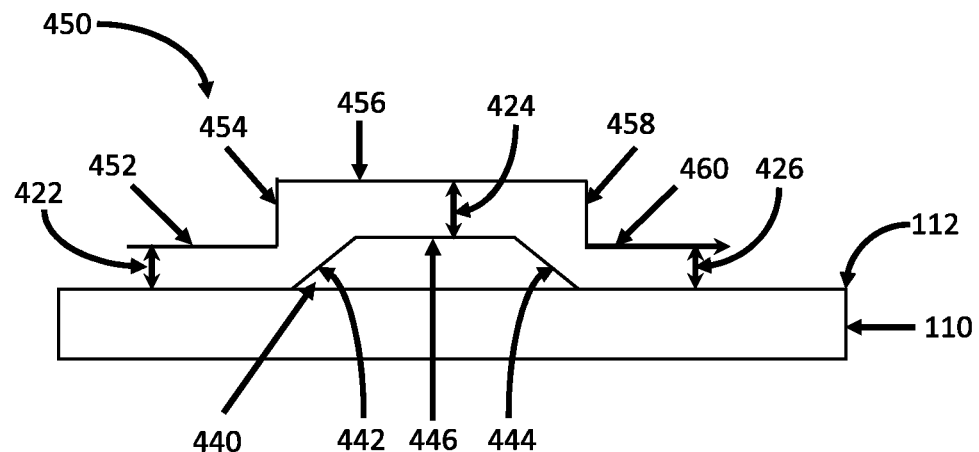
FIGS. 24 and 25 are schematic cross-sectional views of trajectories that traverse a step on a substrate.
Figure 25:
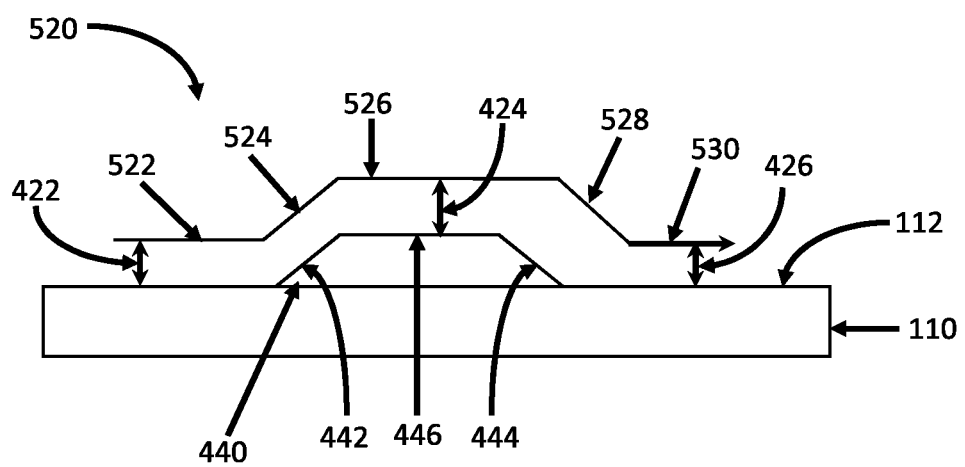

FIGS. 24 and 25 illustrate examples of trajectories that traverse the step shown in FIG. 22. In the FIG. 24 example, a nozzle is displaced along a trajectory 450 according to the following sequence of trajectory segments: a horizontal segment 452, a vertical segment 454, a horizontal segment 456, a vertical segment 458, and a horizontal segment 460. These trajectory segments are drawn to show the approximate height of the nozzle outlet along the trajectory. At horizontal trajectory segment 452, the nozzle is displaced laterally (rightward in FIG. 24) and the nozzle is maintained at a height 422, which may be approximately equal to the adjusted height (step 192 of FIG. 11 or step 294 of FIG. 12). Upon approaching the beginning of the upward step 442, the nozzle is raised along the vertical trajectory segment 454 to reach a height 424 above the plateau 446. This height 424 may be approximately equal to height 422 but must be greater than zero. Then, the nozzle is displaced laterally (rightward in FIG. 24) along a horizontal trajectory segment 456 at a height 424 above the plateau to traverse the existing feature 440. As the nozzle approaches the end of the downward slope 444, the nozzle is lowered along the vertical trajectory segment 458 to reach a height 426 above the substrate 110. The height 426 may be approximately equal to height 422. Then, the nozzle is displaced laterally (rightward in FIG. 24) along a horizontal trajectory segment 460 with the nozzle at height 426.

In the FIG. 25 example, a nozzle is displaced along a trajectory 520 according to the following sequence of trajectory segments: a horizontal segment 522, an upward slope segment 524, a horizontal segment 526, a downward slope segment 528, and a horizontal segment 530. These trajectory segments are drawn to show the approximate height of the nozzle outlet along the trajectory. At horizontal trajectory segment 522, the nozzle is displaced laterally (rightward in FIG. 25) and the nozzle is maintained at a height 422, which may be approximately equal to the adjusted height (step 192 of FIG. 11 or step 294 of FIG. 12). Upon approaching the beginning of the upward step 442, the nozzle is concurrently raised and laterally displaced along an upward slope segment 524 to reach a height 424 above the plateau 446. This height 424 may be approximately equal to height 422 but must be greater than zero. Then, the nozzle is displaced laterally (rightward in FIG. 25) along a horizontal trajectory segment 526 at a height 424 above the plateau to traverse the existing feature 440. As the nozzle approaches the end of the downward step 444, the nozzle is concurrently lowered and laterally displaced along the downward slope segment 528 to reach a height 426 above the substrate 110. The height 426 may be approximately equal to height 422. Then, the nozzle is displaced laterally (rightward in FIG. 25) along a horizontal trajectory segment 530 with the nozzle at height 426.

Additionally, it is possible to traverse existing feature 440 by raising the nozzle at the upward step 442 and concurrently lowering and laterally displacing the nozzle at the downward step 444. It is also possible to traverse feature 440 by concurrently raising and laterally displacing the nozzle at the upward step 442 and lowering the nozzle at the downward step 444.

The Example 7 composition contains 56 wt % silver nanoparticles, propylene glycol as the first solvent, and 4.60 wt % glycerol as the second solvent. The Example 6 composition, which contains 60 wt % silver nanoparticles, propylene glycol as the first solvent, and 4.93 wt % glycerol as the second solvent was also used successfully to print conductive features of high quality. Generally, nanoparticle compositions with high silver nanoparticle concentrations in a range of 50 wt % to 75 wt % are possible. In these compositions, polyvinylpyrrolidone is present on the silver nanoparticle surfaces. A first non-aqueous polar protic solvent having a boiling point in a range of 180° C. to 250° C. and a viscosity in a range of 10 cP to 100 cP at 25° C. is used. Preferably, the first non-aqueous polar protic solvent has two hydroxyl groups. Preferably, the first non-aqueous polar protic solvent is propylene glycol, ethylene glycol, or diethylene glycol. It is preferred that the viscosity of the composition be at least 2000 cP at 25° C.

The compositions can contain solvent(s) other than the first non-aqueous polar protic solvent. It is preferable that the concentration, in aggregate, of solvents other than the first non-aqueous polar protic solvent in the metallic nanoparticle composition not exceed 15 wt %. It is more preferable that the concentration, in aggregate, of solvents other than the first non-aqueous polar protic solvent in the metallic nanoparticle composition not exceed 10 wt %. A second non-aqueous polar protic solvent having a boiling point in a range of 280° C. to 300° C. and a viscosity of at least 100 cP at 25° C. can be used, at a concentration of 15 wt % or less, or 10 wt % or less. Preferably, the second non-aqueous polar protic solvent has three hydroxyl groups. Preferably, the second non-aqueous polar protic solvent is glycerol. Because of the high boiling point of the second non-aqueous polar protic solvent, its presence in the nanoparticle composition prolongs drying time. This effect is pronounced in applications that require the dispensing of the nanoparticle composition in the same location in multiple iterations. As a result, it is preferable to limit the concentration of the second non-aqueous polar protic solvent in the composition to 15 wt % or less, or 10 wt % or less.

In order to bring out the best electrical conductivity in the printed features, it is preferably that the printed features be sintered. Sintering is typically done in a range 300° C. to 500° C. for a period of 5 minutes to 90 minutes. During this high-temperature sintering, some nanoparticle compositions exhibit nanoparticle aggregation, loss of contiguity, and loss of adhesion to the substrate. We have found that these effects can be prevented or reduced by the addition of a titanium precursor compound. Example titanium precursor compounds are: titanium alkoxide (including titanium(IV) butoxide and titanium(IV) isopropoxide), titanium(IV) chloride (including titanium(IV) chloride tetrahydrofuran complex), tetrakis(diethylamido)titanium(IV), and dimethyltitanocene. The Example 10 composition, which contains 57.6 wt % silver nanoparticles, propylene glycol as the first solvent, and no second solvent, and 4 wt % of TBT (titanium (IV) butoxide) was used to print conductive features of high quality and was found to be highly resistant to degradation during sintering. Preferably, the concentration of the titanium precursor compound in the composition does not exceed 5 wt %.

The discussion in the foregoing three paragraphs related to compositions containing silver nanoparticles at concentrations in a range of 50 wt % to 75 wt %. Additionally, compositions containing copper nanoparticles are possible. The Example 9 composition contains 39 wt % copper nanoparticles, propylene glycol as the first solvent, and 8.06 wt % glycerol as the second solvent, and 4 wt % of TBT (titanium(IV) butoxide). FIG. 20 shows a conductive feature 360 after sintering treatment, formed using the Example 9 copper nanoparticle composition. The conductive feature 360 was dispensed according to method 280 (FIG. 12), using a needle 30 (FIGS. 9 and 10). The line width 364 is approximately 350 μm. FIG. 21 is a cross-sectional SEM view of the feature 360 after sintering treatment. The height 374 of the conductive feature 360 is approximately 1200 nm. It can be observed from FIGS. 20 and 21 that there is no nanoparticle aggregation, no loss of contiguity, and no loss of adhesion to the printable surface 112 of the substrate 110.

In addition to the Example 9 composition, other compositions containing copper nanoparticles at a concentration in a range of 32 wt % to 55 wt % were considered (Table 2). The Example 2 composition contains 32-34 wt % copper nanoparticles, propylene glycol as the first solvent, 7.4 wt % glycerol as the second solvent, and other additives (BYK-349 polyether-modified siloxane surfactant at 0.3 wt % and PVP of K30 grade added during formulation step at approximately 2 wt %). The Example 1 composition contains 40-42 wt % copper nanoparticles, propylene glycol as the first solvent, and 8.4 wt % glycerol as the second solvent. The Example 3 composition contains 52-54 wt % copper nanoparticles, propylene glycol as the first solvent, and 8.8 wt % glycerol as the second solvent. Conductive features having excellent homogeneity were obtained using the Example 2, Example 1, and Example 3 compositions, dispensed according to method 280 (FIG. 12).

Generally, nanoparticle compositions with copper nanoparticle concentrations in a range of 32 wt % to 55 wt % are possible. In these compositions, polyvinylpyrrolidone is present on the copper nanoparticle surfaces. A first non-aqueous polar protic solvent having a boiling point in a range of 180° C. to 250° C. and a viscosity in a range of 10 cP to 100 cP at 25° C. is used. Preferably, the first non-aqueous polar protic solvent has two hydroxyl groups. Preferably, the first non-aqueous polar protic solvent is propylene glycol, ethylene glycol, or diethylene glycol. A second non-aqueous polar protic solvent having a boiling point in a range of 280° C. to 300° C. and a viscosity of at least 100 cP at 25° C. is used, at a concentration in a range of 4 wt % to 10 wt %, or preferably in a range of 7 wt % to 9 wt %. Preferably, the second non-aqueous polar protic solvent has three hydroxyl groups. Preferably, the second non-aqueous polar protic solvent is glycerol. It is preferred that the viscosity of the composition be at least 250 cP at 25° C.

It is preferable that the concentration, in aggregate, of solvents other than the first non-aqueous polar protic solvent and the second non-aqueous polar protic solvent in the metallic nanoparticle composition not exceed 6 wt %. The composition may additionally contain a siloxane surfactant, at a concentration that does not exceed 0.5 wt %. The composition may additionally contain a titanium precursor compound, at a concentration that does not exceed 7 wt %.

The discussion in the foregoing four paragraphs related to compositions containing copper nanoparticles at concentrations in a range of 32 wt % to 55 wt %. Additionally, compositions containing copper nanoparticles at concentrations in a range of 50 wt % to 75 wt % are possible. The Example 4 composition contains 52-54 wt % copper nanoparticles, propylene glycol as the first solvent, and no second solvent. Conductive features were dispensed using the Example 4 composition, according to method 280 (FIG. 12). Conductive features having excellent homogeneity were obtained. In these compositions, polyvinylpyrrolidone is present on the copper nanoparticle surfaces. A first non-aqueous polar protic solvent having a boiling point in a range of 180° C. to 250° C. and a viscosity in a range of 10 cP to 100 cP at 25° C. is used. Preferably, the first non-aqueous polar protic solvent has two hydroxyl groups. Preferably, the first non-aqueous polar protic solvent is propylene glycol, ethylene glycol, or diethylene glycol. It is preferred that the viscosity of the composition be at least 1000 cP at 25° C.

The compositions containing copper nanoparticles at concentrations in a range of 50 wt % to 75 wt % can contain solvent(s) other than the first non-aqueous polar protic solvent. It is preferable that the concentration, in aggregate, of solvents other than the first non-aqueous polar protic solvent in the metallic nanoparticle composition not exceed 2 wt %. A second non-aqueous polar protic solvent having a boiling point in a range of 280° C. to 300° C. and a viscosity of at least 100 cP at 25° C. can be used, at a concentration of 2 wt % or less. Preferably, the second non-aqueous polar protic solvent has three hydroxyl groups. Preferably, the second non-aqueous polar protic solvent is glycerol. The composition may additionally contain a siloxane surfactant, at a concentration that does not exceed 0.5 wt %. The composition may additionally contain a titanium precursor compound, at a concentration that does not exceed 5 wt %.

EXAMPLES

Example 1

Reagents:
PVP (K30 grade)
$NaH_2PO_2 \cdot H_2O$
$Cu(NO_3)_2 \cdot 3H_2O$
Ethylene glycol
Propylene glycol
Glycerol (anhydrous)
DI water
Ethanol 96%

1) Synthesis

PVP (100.0 g) and sodium hypophosphite monohydrate (28.6 g) were placed in 2000 ml beaker and 250 ml of ethylene glycol were added. Beaker was placed into oil bath with magnetic stirring (300 RPM). Solution was heated to 150° C. Concomitantly, 15 g of copper nitrate trihydrate with 50 ml of ethylene glycol were placed in 100 ml beaker and stirred to complete dissolution of the salt.

$Cu^{2+}$ solution was poured into $PVP/NaH_2PO_2$ solution at 150° C. (temperature was double checked by external thermometer), and kept at that temperature, under stirring for 2 minutes. After that, 1000 ml of DI water were immediately added to stop the reaction. Intense gas bubbling and color change were observed, from transparent yellow to black and claret at the end of reaction time. After water addition, beaker was placed into cool water bath, and stirred for 10 minutes.

2) Purification

After cooling down to about 50° C., obtained dispersion was divided equally to 4 centrifuge bottles, shaken well and centrifuged at 8000×g (RCF) for 15 min. Supernatant was discarded, and 100 ml of DI water were added to every bottle. Precipitate (shiny red metallic appearance) was re-dispersed in ultrasonic bath for 10 minutes, using a glass rod for mixing. Dispersions were combined into two bottles and then centrifuged for 15 min at 8000×g.

Copper nanoparticles were re-dispersed in 50 ml/bottle of ethanol, combined into 1 bottle and centrifuged again at 6000×g (RCF) for 15 min. Shiny copper cake was re-dispersed in 30 ml ethanol, combined and filtered (1.0 μm GMF) into a 100 ml round bottom flask containing 3.0 ml of propylene glycol. Dispersion was placed in a rotary evaporator for 35 minutes at 40° C. and 35 mbar (first 5 minutes at 110 mbar).

3) Formulation

Obtained 3.5 ml of copper nanoparticles concentrate was mixed with 0.25 ml of glycerol, homogenized in ultrasonic bath and filtered through 1.0 μm GMF filter into clean PP/PE container. Characterization performed by UV-VIS, DLS (0.3 μl of sample diluted in 30 ml of ethylene glycol), TGA in nitrogen atmosphere, and TEM (1 μL of sample to 3 mL EtOH). Copper nanoparticles concentration in obtained formulation estimated to be 40-42 wt % and copper nanoparticles have an average particle size of 160 nm.

Example 2

1) Synthesis
Identical to Example 1.
2) Purification
Identical to Example 1.
3) Formulation Obtained 3.5 ml of copper nanoparticles concentrate was mixed with 0.25 ml of glycerol, 0.75 ml of 11 wt % PVP (K30 grade) solution in propylene glycol, and 3.75 μl of BYK-349 polyether-modified siloxane surfactant. The mixture was homogenized in ultrasonic bath and filtered through 1.0 μm GMF filter into clean PP/PE container. Characterization performed by UV-VIS, DLS (0.3 μl of sample diluted in 30 ml of ethylene glycol), TGA in nitrogen atmosphere, and TEM (1 μL of sample to 3 mL EtOH). Copper nanoparticles concentration in obtained formulation estimated to be 32-34 wt % and copper nanoparticles have an average particle size of 160 nm.

Example 3

1) Synthesis
Identical to Example 1.
2) Purification

After cooling down to about 50° C., obtained dispersion was divided equally to 4 centrifuge bottles, shaken well and centrifuged at 8000×g (RCF) for 15 min. Supernatant was discarded, and 100 ml of DI water were added to every bottle. Precipitate (shiny red metallic appearance) was re-dispersed in ultrasonic bath for 10 minutes, using a glass rod for mixing. Dispersions were combined into two bottles and then centrifuged for 15 min at 8000×g.

Copper nanoparticles were re-dispersed in 50 ml/bottle of ethanol, combined into 1 bottle and centrifuged again at 6000×g (RCF) for 15 min. Shiny copper cake was re-dispersed in 30 ml ethanol, combined and filtered (1.0 μm GMF) into a 100 ml round bottom flask containing 2.0 ml of propylene glycol. Dispersion was placed in a rotary evaporator for 35 minutes at 40° C. and 35 mbar (first 5 minutes at 110 mbar).

3) Formulation

Obtained 2.0 ml of copper nanoparticles concentrate was mixed with 0.15 ml of glycerol, homogenized in ultrasonic bath and filtered through 1.0 μm GMF filter into clean PP/PE container. Characterization performed by UV-VIS, DLS (0.3 μl of sample diluted in 30 ml of ethylene glycol), TGA in nitrogen atmosphere, and TEM (1 μL of sample to 3 mL EtOH). Copper nanoparticles concentration in obtained formulation estimated to be 52-54 wt % and copper nanoparticles have an average particle size of 160 nm.

Example 4

1) Synthesis
Identical to Example 1.
2) Purification

After cooling down to about 50° C., obtained dispersion was divided equally to 4 centrifuge bottles, shaken well and centrifuged at 8000×g (RCF) for 15 min. Supernatant was discarded, and 100 ml of DI water were added to every bottle. Precipitate (shiny red metallic appearance) was re-dispersed in ultrasonic bath for 10 minutes, using a glass rod for mixing. Dispersions were combined into two bottles and then centrifuged for 15 min at 8000×g.

Copper nanoparticles were re-dispersed in 50 ml/bottle of ethanol, combined into 1 bottle and centrifuged again at 6000×g (RCF) for 15 min. Shiny copper cake was re-dispersed in 30 ml ethanol, combined and filtered (1.0 μm GMF) into a 100 ml round bottom flask containing 2.15 ml of propylene glycol. Dispersion was placed in a rotary evaporator for 35 minutes at 40° C. and 35 mbar (first 5 minutes at 110 mbar).
3) Formulation Obtained 2.15 ml of copper nanoparticles concentrate was homogenized in ultrasonic bath and filtered through 1.0 μm GMF filter into clean PP/PE container. Characterization performed by UV-VIS, DLS (0.3 μl of sample diluted in 30 ml of ethylene glycol), TGA in nitrogen atmosphere, and TEM (1 ηL of sample to 3 mL EtOH). Copper nanoparticles concentration in obtained formulation estimated to be 52-54 wt % and copper nanoparticles have an average particle size of 160 nm.

Example 5

Reagents:
$AgNO_3$
PVP (K30 grade)
Ethylene glycol
Acetone
Ethanol 96%

1) Synthesis

Two synthesis reactions were done in parallel. For each synthesis reaction: $AgNO_3$ (12.5 g) was dissolved in 50 mL of Ethylene Glycol at room temperature. In a three-necked flask, PVP (100.2 g) was dissolved in 250 mL of Ethylene Glycol, under reflux, while heating at 140° C. $AgNO_3$ solution was poured in a quick movement (via funnel) into hot PVP dissolved in Ethylene Glycol. Mixtures were heated at 140° C. for 60 min under vigorous stirring. Finally, cooled in cold water bath until room temperature was reached.

2) Purification

Mixture from each synthesis was poured into a 2.5 L beaker. 100 ml of Ethylene Glycol was added to the three-necked reaction flask, sonicated for 1 min under stirring and pooled with the Ag nanoparticle suspension. 1440 ml of Acetone and 160 ml of Ethylene Glycol were mixed in a 2 L beaker and poured into the beaker containing the Ag nanoparticle suspension, under stirring first at 500 rpm, then 900 rpm. Another 40 ml of acetone was then added, then another 40 ml of acetone, and then about 2-3 ml of EG. There was a change in the color of the solution from dark green to brown. The contents of the beaker were poured equally into 6 centrifuge bottles of 500 mL PPCO (Nalgene) and were centrifuged for 15 min@4000×g. Supernatant (orange color) was discarded and the pellets were re-dispersed in 40 ml EtOH (per bottle) under sonication and shaking (10 min). The solution were poured into one bottle, followed by centrifugation for 50 min@17000×g. The pellet was re-dispersed in 80 mL EtOH under sonication and shaking (10 min).

3) Formulation

Approximately 160 ml of obtained dispersion were transferred into a syringe and filtered through 1.0 μm PA filter directly into round-bottom flask. 7.0 mL of propylene glycol were added. Flask was placed on rotary evaporator at 43° C., 110 mbar for 40 min and then set to 35 mbar. Time taken to reach the set pressure was 30 min, and when reached, the condition was maintained for 5 min. A viscous composition was transferred into a syringe and filtered through a 1.0 μm PA filter directly into 5 ml PE syringe (filled from top). Obtained composition is estimated to have a silver nanoparticle concentration of 60 wt %.

Example 6

1) Synthesis

Two synthesis reactions were done in parallel. For each synthesis reaction: $AgNO_3$ (6.25 g) was dissolved in 25 mL of Ethylene Glycol at room temperature. In a three-necked flask, PVP (50.1 g) was dissolved in 125 mL of Ethylene Glycol, under reflux, while heating at 140° C. $AgNO_3$ solution was poured in a quick movement (via funnel) into hot PVP dissolved in Ethylene Glycol. Mixtures were heated at 140° C. for 60 min under vigorous stirring. Finally, cooled in cold water bath until room temperature was reached.

2) Purification

Mixture from each synthesis was poured into a 2 L beaker. 50 ml of Ethylene Glycol was added to the three=necked reaction flask, sonicated for 1 min under stirring and pooled with the Ag nanoparticle suspension. 720 ml of Acetone and 80 ml of Ethylene Glycol were mixed in a 1 L beaker and poured into the beaker containing the Ag nanoparticle suspension, under stirring first at 200 rpm, then 350 rpm. Another 20 ml of acetone was then added, then another 20 ml of acetone, and then about 2-3 ml of EG. There was a change in the color of the solution from dark green to brown. The contents of the beaker were poured equally into 4 centrifuge bottles of 500 mL PPCO (Nalgene) and were centrifuged for 15 min@4000×g. Supernatant (orange color) was discarded and the pellets were re-dispersed in 30 ml EtOH (per bottle) under sonication and shaking (10 min). The solution were poured into one bottle, followed by centrifugation for 35 min@11000×g. The pellet was re-dispersed in 30 mL EtOH under sonication and shaking (10 min).

3) Formulation

Approximately 65 ml of obtained dispersion were transferred into a syringe and filtered through 1.0 μm PA filter directly into round-bottom flask. 2.75 mL of propylene glycol:glycerol (2.6:0.3 volume to volume ratio) mixture were added. Flask was placed on rotary evaporator at 43° C., 110 mbar for 5 min and then set to 35 mbar. Time taken to reach the set pressure was 30 min, and when reached, the condition was maintained for 5 min. A viscous composition was transferred into a syringe and filtered through a 1.0 μm PA filter directly into 5 ml PE syringe (filled from top). Obtained composition is estimated to have a silver nanoparticle concentration of 60 wt %.

Example 7

1) Synthesis
Identical to Example 6.
2) Purification
Identical to Example 6.
3) Formulation A viscous composition having an estimated silver nanoparticle concentration of 60 wt % was obtained, as detailed in Example 6. Then, 71 mg of propylene glycol was added to every 1.0 g of the composition, to dilute (lower) the silver nanoparticle concentration to approximately 56 wt %.

Example 8

1) Synthesis
Identical to Example 6.
2) Purification
Identical to Example 6.
3) Formulation Approximately 65 ml of obtained dispersion were transferred into a syringe and filtered through 1.0 μm PA filter directly into round-bottom flask. 3.0 mL of propylene glycol were added. Flask was placed on rotary evaporator at 43° C., 110 mbar for 5 min and then set to 35 mbar. Time taken to reach the set pressure was 30 min, and when reached, the condition was maintained for 5 min. A viscous composition was transferred into a syringe and filtered through a 1.0 μm PA filter directly into 5 ml PE syringe (filled from top). Obtained composition is estimated to have a silver nanoparticle concentration of 60 wt %. Then, 53 mg of propylene glycol was added to every 1.0 g of the composition, to dilute (lower) the silver nanoparticle concentration to approximately 57 wt %.

Example 9

Reagents:
  PVP (K30 grade)
  $NaH_2PO_2·H_2O$
  $Cu(NO_3)_2·3H_2O$
  Ethylene glycol
  Propylene glycol
  Glycerol (anhydrous)
  DI water
  Ethanol 96%
  Titanium(IV) butoxide (TBT)
1) Synthesis
  Identical to Example 1.
2) Purification
  Identical to Example 1.
3) Formulation
  Obtained 3.5 ml of copper nanoparticles concentrate was mixed with 0.25 ml of glycerol and 0.26 ml of TBT, homogenized in ultrasonic bath and filtered through 1.0 μm GMF filter into clean PP/PE container. Characterization performed by UV-VIS, DLS (0.3 μl of sample diluted in 30 ml of ethylene glycol), TGA in nitrogen atmosphere, and TEM (1 μL of sample to 3 mL EtOH). Copper nanoparticles concentration in obtained formulation estimated to be approximately 39 wt % and copper nanoparticles have an average particle size of 160 nm. The concentration of TBT in the composition is approximately 4 wt %.

Example 10

Reagents:
  $AgNO_3$
  PVP (K30 grade)
  Ethylene glycol
  Acetone
  Ethanol 96%
  Titanium(IV) butoxide (TBT)
1) Synthesis
  Identical to Example 5.
2) Purification
  Identical to Example 5.
3) Formulation
  Approximately 160 ml of obtained dispersion were transferred into a syringe and filtered through 1.0 μm PA filter directly into round-bottom flask. 7.0 mL of propylene glycol were added. Flask was placed on rotary evaporator at 43° C., 110 mbar for 40 min and then set to 35 mbar. Time taken to reach the set pressure was 30 min, and when reached, the condition was maintained for 5 min. A viscous composition was transferred into a PP container, 42 μl of TBT was added to every 1.0 g of the composition. Ink was mixed and homogenized and filtered through a 1.0 μm PA filter directly into 5 ml PE syringe (filled from top). Obtained composition is estimated to have silver nanoparticle concentration of 57.6 wt % and TBT concentration of 4.0 wt %.

Example 11

1) Synthesis
  Identical to Example 6.
2) Purification
  Identical to Example 6.
3) Formulation
  Approximately 65 ml of obtained dispersion were transferred into a syringe and filtered through 1.0 μm PA filter directly into round-bottom flask. 3.0 mL of propylene glycol were added. Flask was placed on rotary evaporator at 43° C., 110 mbar for 5 min and then set to 35 mbar. Time taken to reach the set pressure was 30 min, and when reached, the condition was maintained for 5 min. A viscous composition was transferred into a syringe and filtered through a 1.0 μm PA filter directly into 5 ml PE syringe (filled from top). Obtained composition is estimated to have a silver nanoparticle concentration of 60 wt %. Then, 91 mg of propylene glycol was added to every 1.0 g of the composition, to dilute (lower) the silver nanoparticle concentration to approximately 55 wt %.

Unless otherwise indicated, all numbers expressing quantities of components, molecular weights, and so forth used in the specification and claims are to be understood as being modified in all instances by the term "about." Accordingly, unless otherwise indicated to the contrary, the numerical parameters set forth in the specification and claims are approximations that may vary depending upon the desired properties sought to be obtained by the present invention. At the very least, and not as an attempt to limit the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. All numerical values, however, inherently contain a range necessarily resulting from the standard deviation found in their respective testing measurements.

All headings are for the convenience of the reader and should not be used to limit the meaning of the text that follows the heading, unless so specified.

What is claimed is:

1. A method of dispensing a metallic nanoparticle composition along a trajectory on a substrate, comprising of steps of:
  providing a nozzle comprising an inlet, an outlet, and an elongate fluid passageway between the inlet and the outlet, the outlet pointing downward toward the substrate, the outlet being characterized by an outlet size;
  providing a metallic nanoparticle composition in the nozzle;
  initializing the nozzle;
  initializing a fluid bridge; and
  dispensing the composition from the nozzle onto the substrate;
  wherein the step of initializing the nozzle comprises applying an initial pressure to the composition in the nozzle to cause the composition to flow from the outlet and positioning the outlet at an initial height above the substrate such that the composition does not flow onto the substrate;

wherein the step of initializing a fluid bridge is carried out after the step of initializing the nozzle and comprises (1) lowering the outlet from the initial height toward the substrate such that a fluid bridge forms between the outlet and the substrate and the outlet is not in direct contact with the substrate, and (2) applying an adjusted pressure to the composition, the adjusted pressure being lower than needed for the composition to continue to flow from the outlet; and wherein the step of dispensing the composition from the nozzle onto the substrate is carried out after the step of initializing a fluid bridge and comprises applying a dispensing pressure to the composition while laterally displacing the nozzle along the trajectory on the substrate, the dispensing pressure being less than or equal to the adjusted pressure, wherein a viscosity of the composition is at least 250 cP at 25° C.

2. The method of claim 1, wherein the fluid passageway comprises a tapering portion that tapers toward the outlet.

3. The method of claim 1, wherein the initial height is 5 μm or greater.

4. The method of claim 1, wherein the step of adjusting a vertical position of the nozzle comprises lowering the outlet to an adjusted height above the substrate, the adjusted height being 50 nm or greater.

5. The method of claim 1, wherein the outlet size is in a range of 700 nm to 40 μm.

6. The method of claim 5, wherein the outlet size is in a range of 700 nm to 5 μm.

7. The method of claim 1, wherein the initial pressure is in a range of 1.0 bar to 3.0 bar.

8. The method of claim 1, wherein the adjusted pressure is in a range of 10 mbar to 200 mbar.

9. The method of claim 1, wherein the dispensing pressure is less than or equal to 100 mbar.

10. The method of claim 1, wherein the composition comprises silver nanoparticles or copper nanoparticles.

11. The method of claim 1, wherein a viscosity of the of the composition is at least 2000 cP at 25° C.

12. The method of claim 1, wherein the step of dispensing the composition from the nozzle additionally comprises raising the nozzle at an upward step along the trajectory on the substrate.

13. The method of claim 12, wherein the raising of the nozzle at an upward step and the lateral displacement of the nozzle are carried out concurrently.

14. The method of claim 12, wherein the raising of the nozzle at an upward step and the lateral displacement of the nozzle are carried out sequentially.

15. The method of claim 1, wherein the step of dispensing the composition from the nozzle additionally comprises lowering the nozzle at a downward step along the trajectory on the substrate.

16. The method of claim 15, wherein the lowering of the nozzle at a downward step and the lateral displacement of the nozzle are carried out concurrently.

17. The method of claim 15, wherein the lowering of the nozzle at a downward step and the lateral displacement of the nozzle are carried out sequentially.

18. A method of dispensing a metallic nanoparticle composition along a trajectory on a substrate, comprising the steps of:

providing a nozzle comprising an inlet, an outlet, and an elongate fluid passageway between the inlet and the outlet, the outlet pointing downward toward the substrate, the outlet being characterized by an outlet size;

providing a metallic nanoparticle composition in the nozzle;

initializing a meniscus;

initializing a fluid bridge;

adjusting a vertical position of the nozzle; and dispensing the composition from the nozzle onto the substrate;

wherein the step of initializing a meniscus comprises positioning the outlet at an initial height above the substrate and applying an initial pressure to the composition in the nozzle to cause a meniscus to protrude downward from the outlet toward the substrate;

wherein the step of initializing a fluid bridge is carried out after the step of initializing a meniscus and comprises lowering the outlet to an intermediate height above the substrate and applying an intermediate pressure to the composition, such that a fluid bridge forms between the outlet and the substrate and the outlet is not in direct contact with the substrate;

wherein the step of adjusting a vertical position of the nozzle is carried out after the step of initializing a fluid bridge and comprises positioning the outlet at an adjusted height above the substrate greater than the intermediate height and applying an adjusted pressure to the composition, such that the fluid bridge remains in contact with the outlet and the substrate; and wherein the step of dispensing the composition from the nozzle onto the substrate is carried out after the step of adjusting a vertical position of the nozzle and comprises applying a dispensing pressure to the composition while laterally displacing the nozzle along the trajectory on the substrate.

19. The method of claim 18, wherein the initial height is in a range of 30 μm to 80 μm.

20. The method of claim 18, wherein the intermediate height is in a range of 1 μm to 5 μm.

21. The method of claim 18, wherein the adjusted height is greater than the intermediate height by a difference ranging between 10 μm and 20 μm.

22. The method of claim 18, wherein the outlet size is in a range of 100 μm to 150 μm.

23. The method of claim 18, wherein the initial pressure is in a range of 25 mbar to 100 mbar.

24. The method of claim 18, wherein the intermediate pressure is in a range of 10 mbar to 50 mbar.

25. The method of claim 18, wherein the adjusted pressure is in a range of 10 mbar to 50 mbar.

26. The method of claim 18, wherein the dispensing pressure is in a range of 10 mbar to 50 mbar.

27. The method of claim 18, wherein the composition comprises copper nanoparticles or silver nanoparticles.

28. The method of claim 18, wherein a viscosity of the of the composition is at least 250 cP at 25° C.

29. The method of claim 28, wherein the viscosity is at least 1000 cP at 25° C.

30. The method of claim 18, wherein the step of dispensing the composition from the nozzle additionally comprises raising the nozzle at an upward step along the trajectory on the substrate.

31. The method of claim 30, wherein the raising of the nozzle at an upward step and the lateral displacement of the nozzle are carried out concurrently.

32. The method of claim 30, wherein the raising of the nozzle at an upward step and the lateral displacement of the nozzle are carried out sequentially.

33. The method of claim 18, wherein the step of dispensing the composition from the nozzle additionally comprises lowering the nozzle at a downward step along the trajectory on the substrate.

34. The method of claim 33, wherein the lowering of the nozzle at a downward step and the lateral displacement of the nozzle are carried out concurrently.

35. The method of claim 33, wherein the lowering of the nozzle at a downward step and the lateral displacement of the nozzle are carried out sequentially.

36. The method of claim 18, wherein the nozzle is tilted relative to the vertical, an angle of tilt ranging between 30° to 60°.

37. A method of dispensing a metallic nanoparticle composition along a trajectory on a substrate, comprising the steps of:
   providing a nozzle comprising an inlet, an outlet, and an elongate fluid passageway
   between the inlet and the outlet, the outlet pointing downward toward the substrate, the outlet being characterized by an outlet size;
   providing a metallic nanoparticle composition in the nozzle;
   initializing the nozzle;
   initializing a fluid bridge; and
   dispensing the composition from the nozzle onto the substrate;
   wherein the step of initializing the nozzle comprises applying an initial pressure to the composition in the nozzle and positioning the outlet at an initial height above the substrate such that the composition does not flow onto the substrate;
   wherein the step of initializing a fluid bridge is carried out after the step of initializing the nozzle and comprises (1) lowering the outlet from the initial height toward the substrate such that a fluid bridge forms between the outlet and the substrate and the outlet is not in direct contact with the substrate, and (2) applying an adjusted pressure to the composition, the adjusted pressure being lower than needed for the composition to flow from the outlet; and
   wherein the step of dispensing the composition from the nozzle onto the substrate is carried out after the step of initializing a fluid bridge and comprises applying a dispensing pressure to the composition while laterally displacing the nozzle along the trajectory on the substrate, the dispensing pressure being sufficient to dispense the composition onto the substrate.

* * * * *